(12) United States Patent
Kim et al.

(10) Patent No.: US 11,856,832 B2
(45) Date of Patent: Dec. 26, 2023

(54) ELECTRONIC PANEL AND METHOD FOR MANUFACTURING THE SAME

(71) Applicant: Samsung Display Co., Ltd., Yongin-Si (KR)

(72) Inventors: Ji-hyun Kim, Hwaseong-si (KR); Junhong Park, Suwon-si (KR); Jun Chun, Hwaseong-si (KR); Euisuk Jung, Seoul (KR); Hoon Kang, Yongin-si (KR); Jeongmin Park, Seoul (KR)

(73) Assignee: Samsung Display Co., Ltd., Yongin-Si (KR)

( * ) Notice: Subject to any disclaimer, the term of this patent is extended or adjusted under 35 U.S.C. 154(b) by 474 days.

(21) Appl. No.: 17/182,042

(22) Filed: Feb. 22, 2021

(65) Prior Publication Data

US 2021/0175293 A1 Jun. 10, 2021

Related U.S. Application Data

(62) Division of application No. 16/440,788, filed on Jun. 13, 2019, now Pat. No. 10,957,747.

(30) Foreign Application Priority Data

Sep. 4, 2018 (KR) .......................... 10-2018-0105478

(51) Int. Cl.
*H01L 27/00* (2006.01)
*H10K 59/40* (2023.01)
(Continued)

(52) U.S. Cl.
CPC .............. *H10K 59/40* (2023.02); *G06F 3/044* (2013.01); *G06F 3/0412* (2013.01);
(Continued)

(58) Field of Classification Search
CPC ...... H10K 59/40; H10K 59/24; H10K 71/621; H01L 27/00
See application file for complete search history.

(56) References Cited

U.S. PATENT DOCUMENTS

| 10,068,951 B2 | 9/2018 | Choi et al. |
| 2015/0187802 A1* | 7/2015 | Lee ..................... H01L 27/1248 257/734 |

(Continued)

FOREIGN PATENT DOCUMENTS

| KR | 10-2016-0034120 A | 3/2016 |
| KR | 10-2017-0067592 A | 6/2017 |

(Continued)

*Primary Examiner* — Binh X Tran
(74) *Attorney, Agent, or Firm* — Innovation Counsel LLP

(57) ABSTRACT

An electronic device includes an electronic panel including an active area and a pad area and including an input sensing member and a circuit board overlapping at least a side of the pad area. The electronic panel includes a first conductive layer, a second conductive layer, a first organic insulation layer disposed between the first conductive layer and the second conductive layer, a pattern layer disposed on the second conductive layer, overlapping the plurality of second conductive patterns, and including a plurality of organic patterns, and a second organic insulation layer covering the pattern layer and the second conductive layer. The pattern layer covers an upper surface of the second conductive layer.

3 Claims, 25 Drawing Sheets

(51) Int. Cl.
   *G06F 3/041*   (2006.01)
   *G06F 3/044*   (2006.01)
   *H10K 59/124*  (2023.01)
   *H10K 71/00*   (2023.01)
   *H10K 99/00*   (2023.01)

(52) U.S. Cl.
   CPC ......... *H10K 59/124* (2023.02); *H10K 71/621* (2023.02); *H10K 99/00* (2023.02); *H01L 27/00* (2013.01)

(56) References Cited

U.S. PATENT DOCUMENTS

| | | | |
|---|---|---|---|
| 2017/0062494 A1* | 3/2017 | Lee | H01L 29/78633 |
| 2017/0365654 A1 | 12/2017 | Park et al. | |
| 2018/0182821 A1* | 6/2018 | Yun | G06F 3/0443 |
| 2018/0188866 A1 | 7/2018 | Heo et al. | |
| 2018/0331160 A1 | 11/2018 | Beak et al. | |
| 2019/0097171 A1 | 3/2019 | Park | |
| 2019/0214452 A1* | 7/2019 | Park | H10K 71/00 |
| 2020/0303467 A1* | 9/2020 | Feng | G06F 3/047 |

FOREIGN PATENT DOCUMENTS

| | | |
|---|---|---|
| KR | 10-2017-0136689 A | 12/2017 |
| KR | 10-2017-0143129 A | 12/2017 |
| KR | 10-2019-0034386 A | 4/2019 |

\* cited by examiner

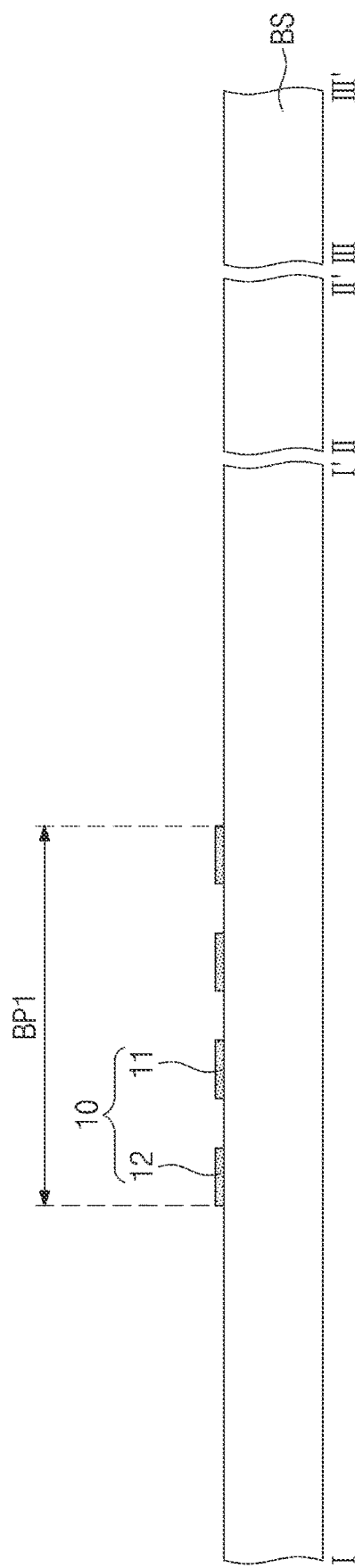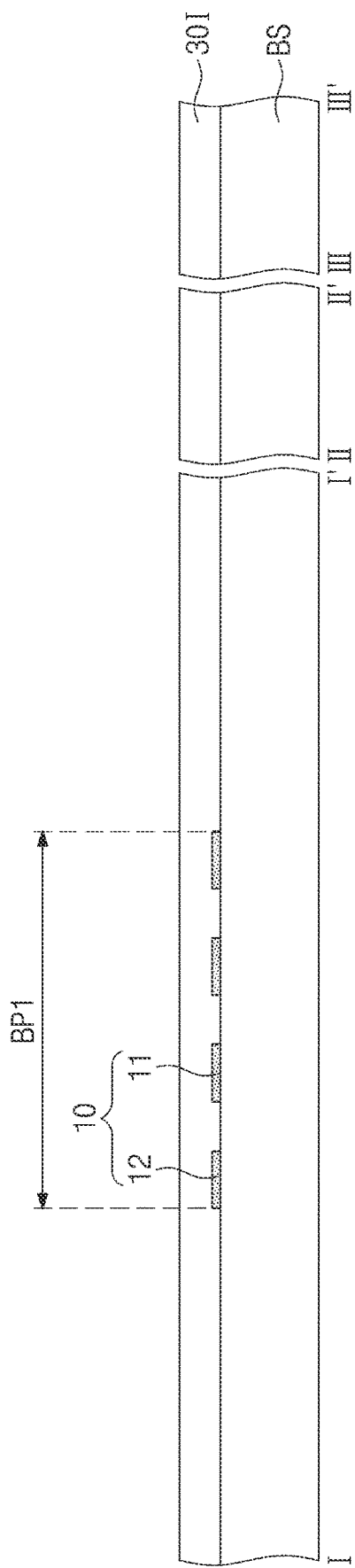

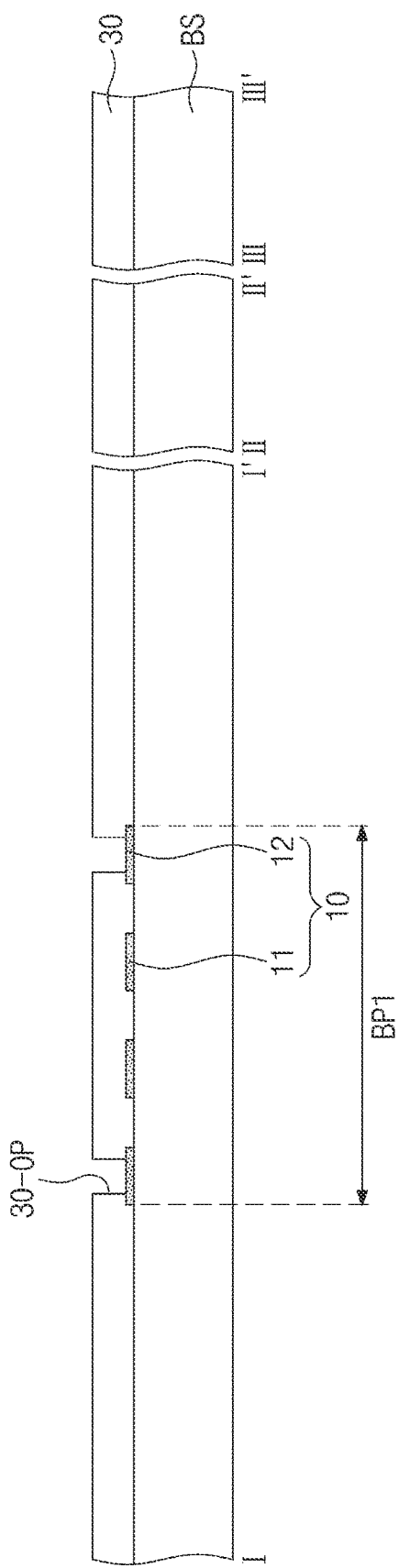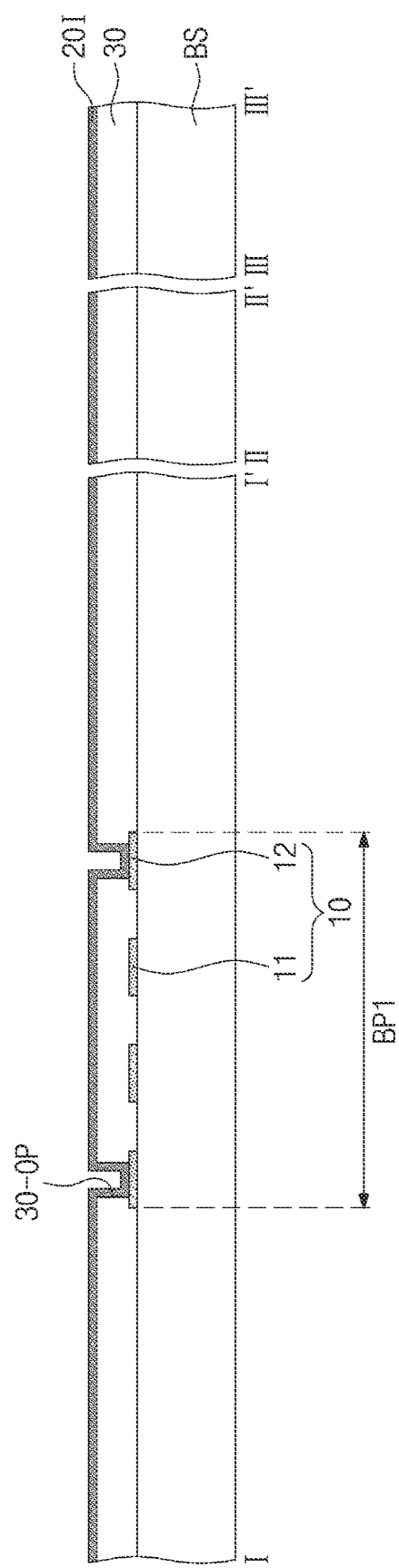

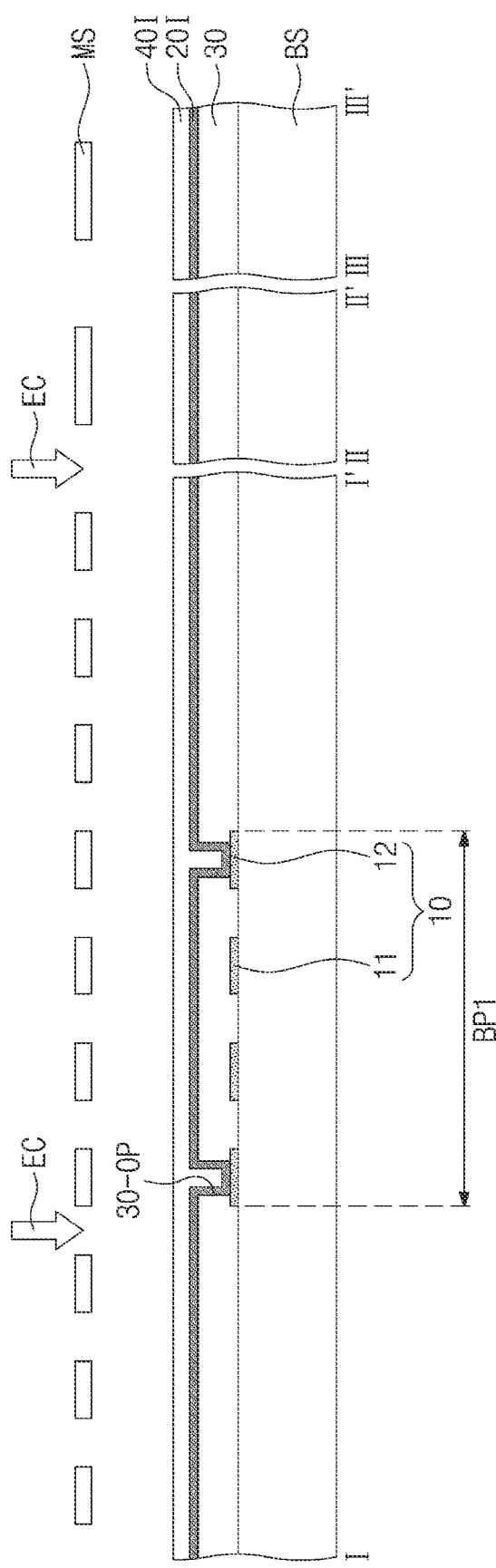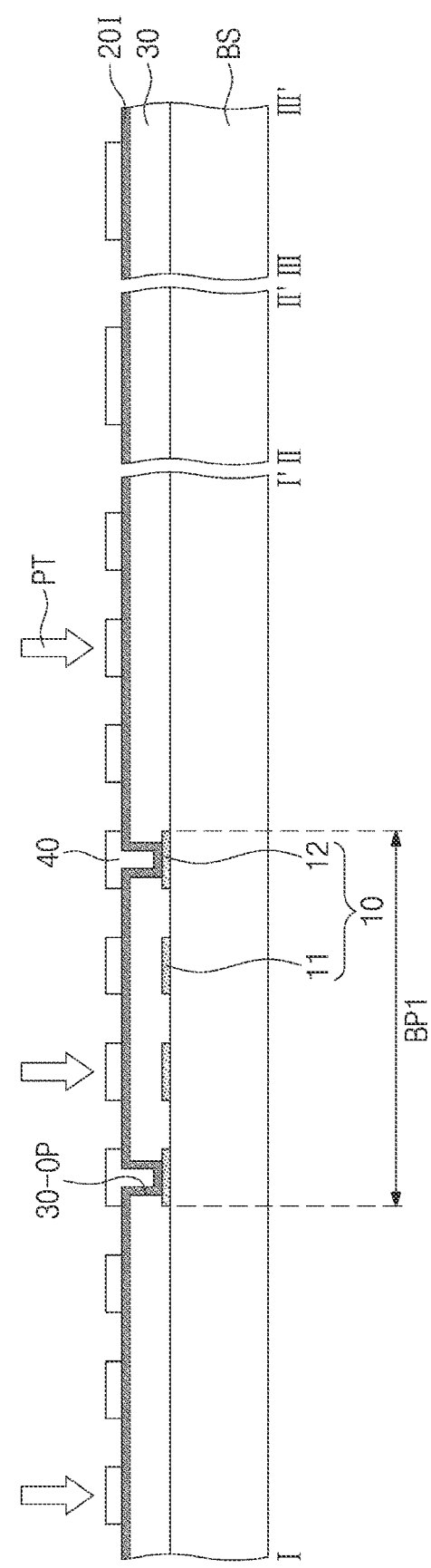

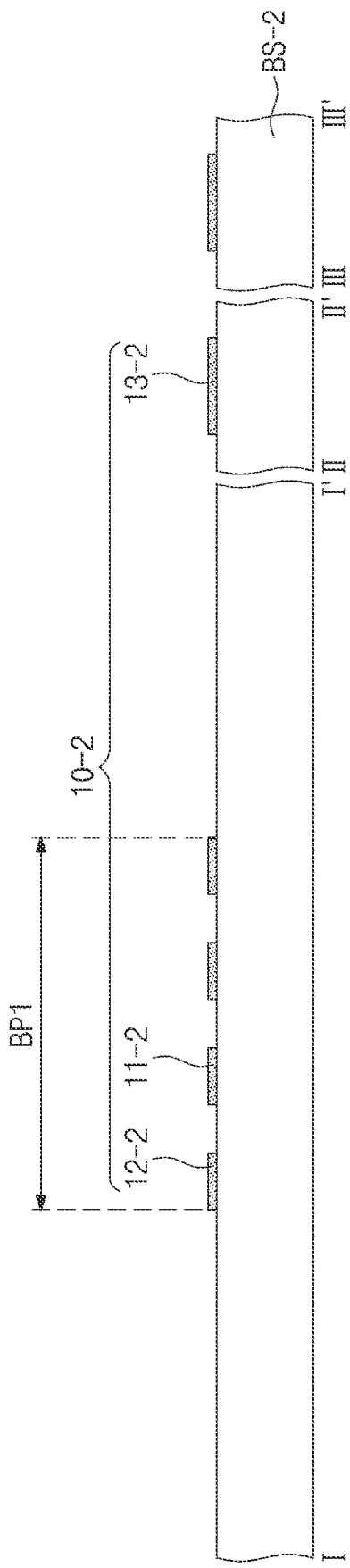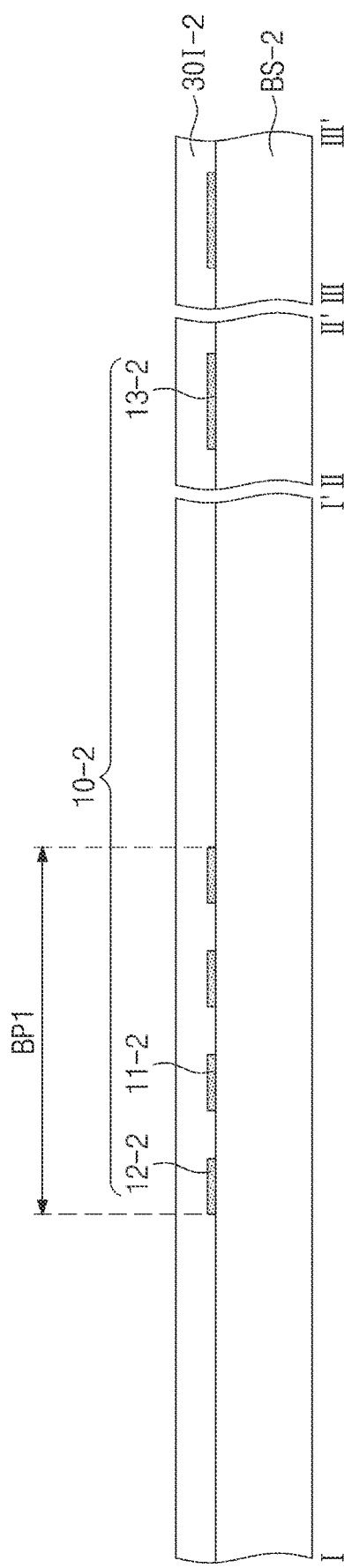

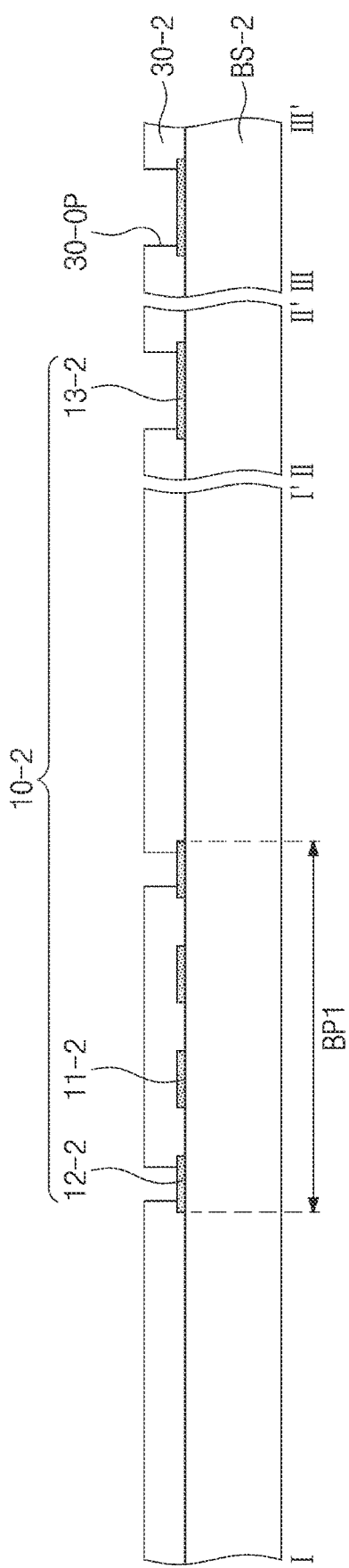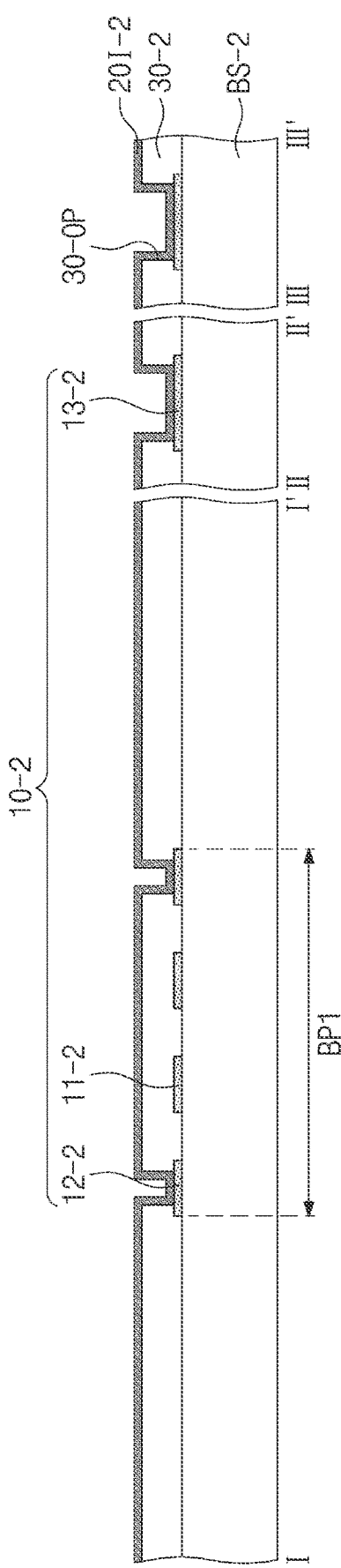

ELECTRONIC PANEL AND METHOD FOR MANUFACTURING THE SAME

CROSS-REFERENCE TO RELATED APPLICATIONS

This application is a divisional application of U.S. patent application Ser. No. 16/440,788 filed Jun. 13, 2019, which claims priority under 35 U.S.C. § 119 to Korean Patent Application No. 10-2018-0105478, filed on Sep. 4, 2018, the disclosures of which are hereby incorporated by reference in their entirety.

BACKGROUND

The present disclosure relates to an electronic panel and a method for manufacturing the same, and more particularly, to an electronic panel having improved process reliability and a method for manufacturing the same.

Electronic devices receive an electrical signal to be activated. The electronic device may include an electronic panel that can sense various types of external inputs. The electronic panel may be used alone or may further include a display member or the like for displaying an image to provide a user's convenience.

The electronic device may include various electrode patterns to be activated by an electrical signal. An area on which the electrode patterns are activated may display information or respond to a user's touch input.

SUMMARY

The present disclosure provides an electronic panel having a structure that is capable of improving chemical resistance to an organic insulation layer.

The present disclosure also provides a method for manufacturing an electronic panel that can achieve improved process reliability by preventing a damage to an organic insulation layer.

An embodiment of the inventive concept provides an electronic device including: an electronic panel including an active area and a pad area and including an input sensing member; and a circuit board overlapping at least a side of the pad area, wherein the electronic panel includes: a first conductive layer including a plurality of first conductive patterns disposed in the active area; a second conductive layer disposed on the first conductive layer and including a plurality of second conductive patterns disposed in the active area; a first organic insulation layer disposed between the first conductive layer and the second conductive layer; a pattern layer disposed on the plurality of second conductive layer, overlapping the second conductive patterns, and including a plurality of organic patterns; and a second organic insulation layer covering the pattern layer and the second conductive layer, wherein the pattern layer covers an upper surface of the second conductive layer.

In an embodiment, the pattern layer may include the same material as the second organic insulation layer.

In an embodiment, the pattern layer may not overlap a portion of a top surface of the first organic insulation layer that is exposed by the plurality of second conductive patterns and contact top surfaces of the plurality of second conductive patterns.

In an embodiment, the plurality of second conductive patterns may include: first patterns disposed on the first organic insulation layer; and second patterns passing through the first organic insulation layer and connected to at least one of the plurality of first conductive patterns.

In an embodiment, the plurality of second conductive patterns may include mesh lines defining a plurality of openings through which the top surface of the first organic insulation layer is exposed, the first patterns and the second patterns may correspond to the mesh lines, respectively, and the pattern layer may cover a top surface of the mesh lines and expose the top surface of the first organic insulation layer that is exposed by the plurality of openings.

In an embodiment, the second conductive layer may include a connection pattern disposed in the pad area, and the second organic insulation layer may have a first opening through which a portion of a top surface of the connection pattern is exposed.

In an embodiment, the circuit board may be connected to a portion of the top surface of the connection pattern that is exposed by the first opening of the second organic insulation layer.

In an embodiment, the plurality of first conductive patterns may include a lower connection pattern disposed in the pad area to overlap the connection pattern, and the connection pattern may pass through the first organic insulation layer and be connected to the lower connection pattern.

In an embodiment, the electronic device may further include a pad pattern layer that is disposed between the connection pattern and the second organic insulation layer and in which a second opening overlapping the first opening to expose a portion of the top surface of the connection pattern is formed, wherein the pad pattern layer may include the same material as the pattern layer.

In an embodiment, the electronic panel may further include a plurality of light emitting areas and further includes a display member on which the input sensing member is disposed, wherein the display member may include: a base layer including a plurality of transistors; a pixel defining layer that is disposed on the base layer and in which a plurality of openings defining the plurality of light emitting areas are formed; organic light emitting elements respectively connected to the transistors and configured to display light on corresponding light emitting areas of the plurality of light emitting areas; and an encapsulation layer covering the organic light emitting elements, wherein the input sensing member may be directly disposed on the encapsulation layer.

In an embodiment, the plurality of organic patterns may overlap the pixel defining layer and do not overlap the plurality of light emitting areas.

In an embodiment of the inventive concept, an electronic panel includes: a display member including a plurality of light emitting areas; and an input sensing member disposed on the display member and including an active area that senses a touch input and a pad area adjacent to the active area, wherein the input sensing member includes: a sensing electrode including a plurality of sensor patterns disposed in the active area; a connection electrode connected to at least a portion of the plurality of sensor patterns; a first organic insulation layer disposed between the sensing electrode and the connection electrode; a pattern layer disposed on the sensing electrode, overlapping the sensing electrode and including a plurality of organic patterns; and a second organic insulation layer covering the pattern layer and the sensing electrode, wherein the plurality of organic patterns covers the plurality of sensor patterns.

In an embodiment, the sensing electrode may include first sensor patterns, second sensor patterns spaced apart from the first sensor patterns, and second connection patterns connected to at least a portion of the second sensor patterns, one of the first sensor patterns may pass through the first organic insulation layer and is connected to the connection electrode, and the plurality of organic patterns may contact a top surface of each of the first sensor patterns, the second sensor patterns, and the second connection patterns.

In an embodiment, the first sensor patterns, the second sensor patterns, and the second connection patterns may include mesh lines defining a plurality of openings through which a top surface of the first organic insulation layer is exposed, and the plurality of organic patterns may cover the top surface of the mesh lines and expose the top surface of the first organic insulation layer that is exposed by the plurality of openings.

In an embodiment, the display member may include: a base layer including a plurality of transistors; a pixel defining layer that is disposed on the base layer and in which a plurality of openings defining the plurality of light emitting areas are formed; organic light emitting elements respectively connected to the plurality of transistors and configured to display light on corresponding light emitting areas of the plurality of light emitting areas; and an encapsulation layer covering the organic light emitting elements, wherein the mesh lines may overlap the pixel defining layer.

In an embodiment, the input sensing member may further include a connection pattern disposed in the pad area and connected to the sensing electrode, and the second organic insulation layer may have a first opening through which a portion of a top surface of the connection pattern is exposed.

In an embodiment, the input sensing member may further include: a lower connection pattern disposed in the pad area and connected to the connection pattern; and a pad pattern layer disposed between the connection pattern and the second organic insulation layer to overlap the first opening and define a second opening through which the portion of the top surface of the connection pattern is exposed, wherein the pad pattern layer may include the same material as the pattern layer.

In an embodiment of the inventive concept, a method for manufacturing an electronic panel includes: forming first conductive patterns on a base substrate; forming a first organic insulation layer covering the first conductive patterns; forming a preliminary conductive layer on the first organic insulation layer; forming a preliminary pattern layer on the preliminary conductive layer; etching the preliminary pattern layer by using a first mask to form a plurality of organic patterns; patterning the preliminary conductive layer by using the plurality of organic patterns as a second mask to form second conductive patterns; and forming a second organic insulation layer on the second conductive patterns, wherein the plurality of organic patterns are made of the same material as the second organic insulation layer.

In an embodiment, after the forming of the plurality of organic patterns, the method may further include etching a portion of the plurality of organic patterns by using the first mask and the second mask to expose a top surface of each of the second conductive patterns that overlaps the portion of the plurality of organic patterns that is etched.

In an embodiment, the second organic insulation layer may cover top surfaces of the plurality of organic patterns and a top surface of the first organic insulation layer that is exposed by the plurality of organic patterns.

BRIEF DESCRIPTION OF THE FIGURES

The accompanying drawings are included to provide a further understanding of the inventive concept, and are incorporated in and form a part of the present disclosure. The drawings illustrate exemplary embodiments of the inventive concept and, together with the description, serve to explain principles of the inventive concept. In the drawings:

FIGS. 10A to 10I are cross-sectional views illustrating a method for manufacturing an electronic panel according to an embodiment of the inventive concept; and FIGS. 11A to 11J are cross-sectional views illustrating a method of manufacturing an electronic panel according to an embodiment of the inventive concept.

DETAILED DESCRIPTION

Figure 1:
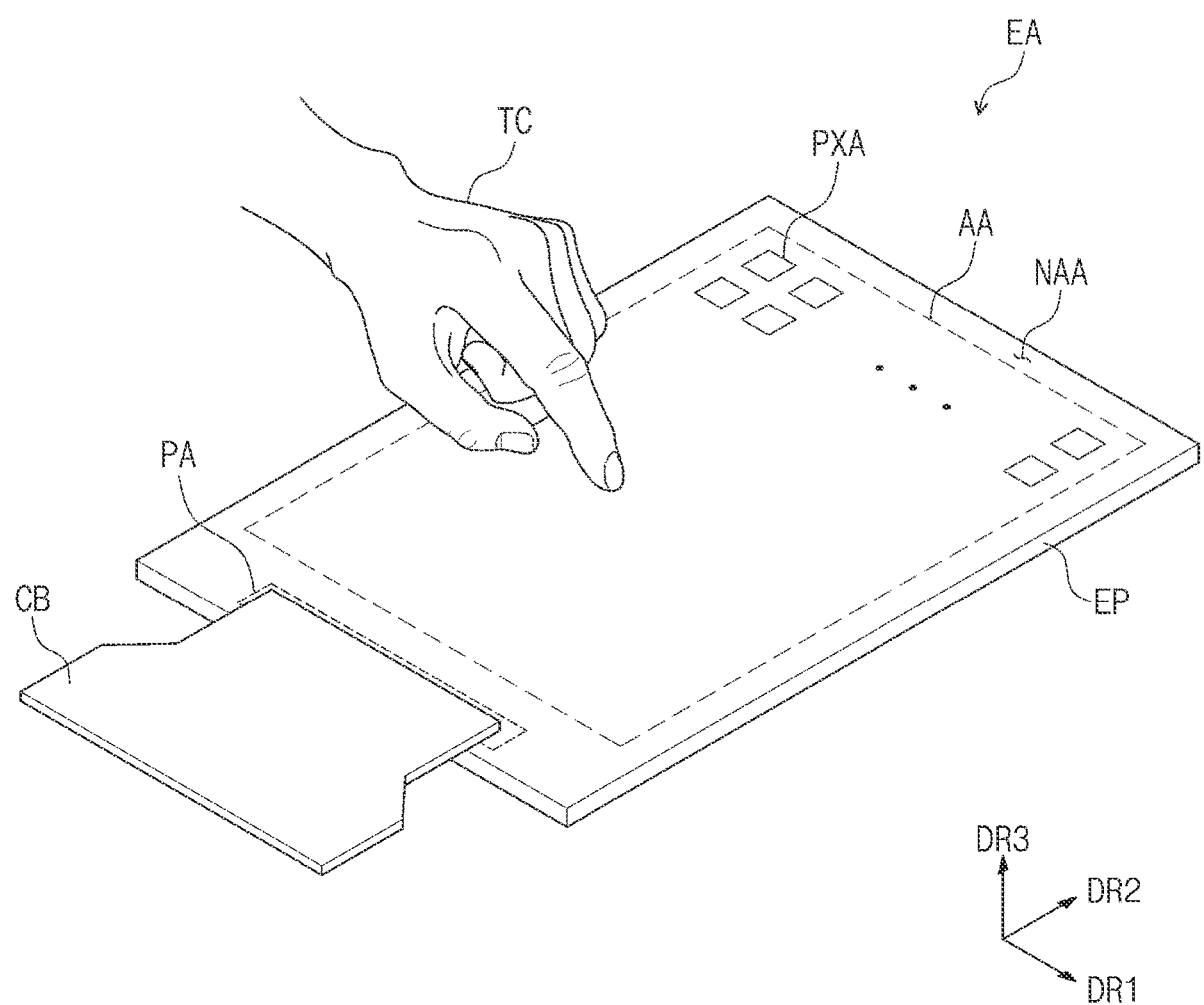
FIG. 1 is a perspective view of an electronic device according to an embodiment of the inventive concept.

In the present disclosure, it will also be understood that when one component (or region, layer, portion) is referred to as being "on," "connected to," or "coupled to" another component (or region, layer, portion), it can be directly disposed/connected/coupled on/to the one component, or one or more intervening third components may also be present therebetween.

Like reference numerals refer to like elements throughout the present disclosure. In addition, in the drawings, thicknesses, ratios, and dimensions of components may be exaggerated for clarity and convenience of illustration.

The term "and/or" includes any and all combinations of one or more of the associated listed items.

It will be understood that although the terms such as "first" and "second" are used herein to describe various elements, these elements should not be limited by these terms. The terms are only used to distinguish one element from other elements. For example, an element referred to as a first element in one embodiment may be referred to as a second element in another embodiment without departing from the scope of the present disclosure. The terms of a singular form may include a plural form unless explicitly described to the contrary.

In addition, "under," "below," "above," "upper," and the like are used for explaining associative relation of components illustrated in the drawings. These terms may be a relative concept and described based on directions expressed in the drawings without being limited thereto.

Unless otherwise defined, all terms (including technical and scientific terms) used herein have the same meaning as commonly understood by a person of ordinary skill in the art to which the present disclosure belongs. In addition, terms that are defined in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component, or a combination thereof, but does not exclude other properties, fixed numbers, steps, operations, elements, components, or combinations thereof. Hereinafter, exemplary embodiments of the inventive concept will be described with reference to the accompanying drawings.

Figure 2A:
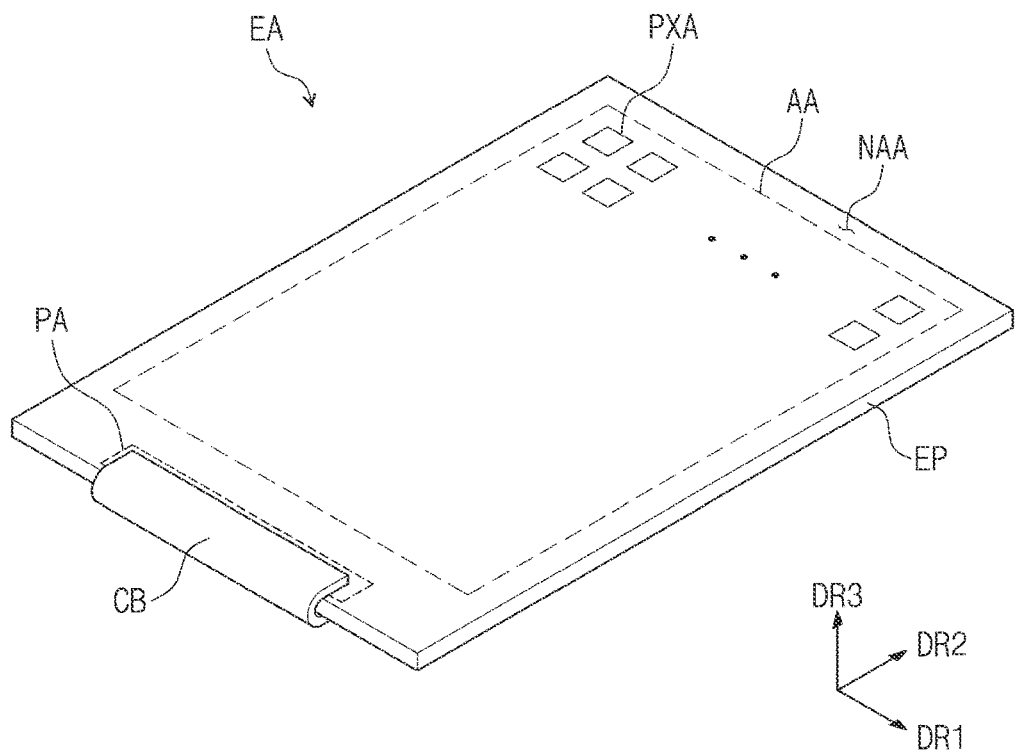
FIGS. 2A to 2C are perspective views of an electronic panel according to an embodiment of the inventive concept.
Figure 2B:
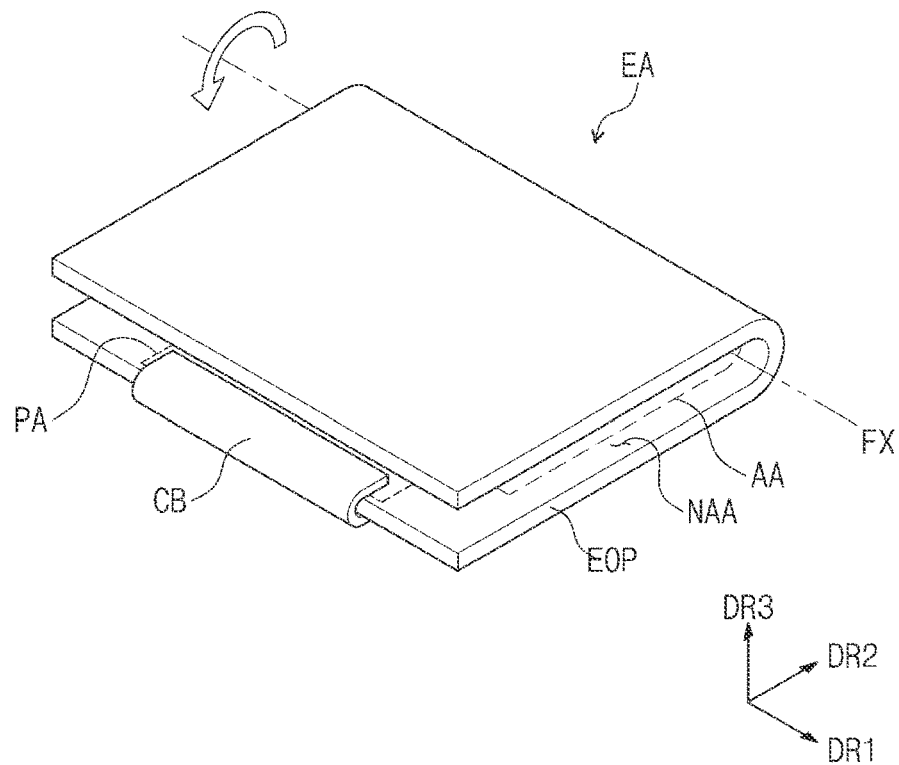
Figure 2C:
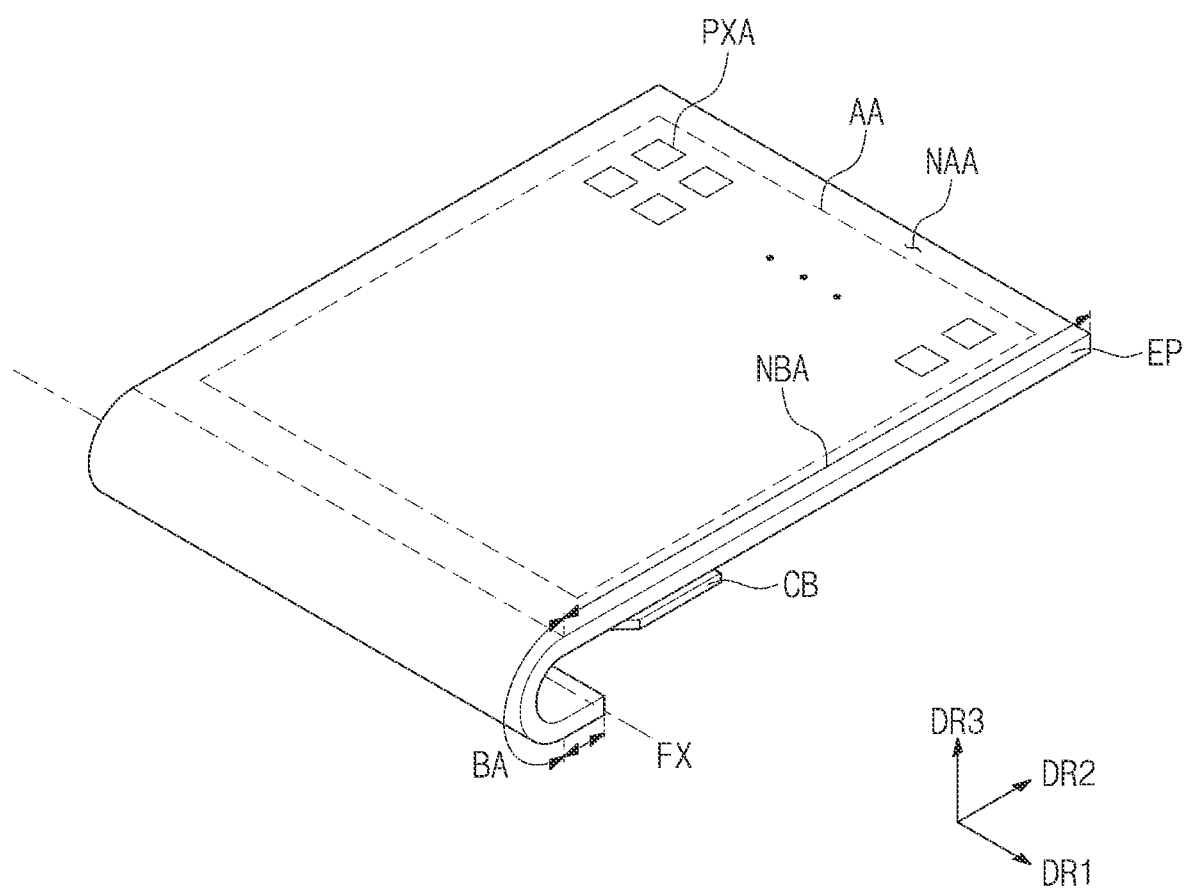

FIG. 1 is a perspective view of an electronic device according to an embodiment of the inventive concept. FIGS. 2A to 2C are perspective views of an electronic panel according to an embodiment of the inventive concept. Hereinafter, an electronic device according to an embodiment of the inventive concept will be described with reference to FIGS. 1 and 2A to 2C.

Referring to FIG. 1, an electronic device EA may be a device that can be activated according to an electrical signal. Examples of the electronic device EA include, but are not limited to a tablet computer, a notebook computer, and a smart television. In the present embodiment, a smart phone will be described as an example of the electronic device EA.

The electronic device EA may have a hexahedral shape having a thickness in a third direction DR3 that is normal to a plane that is defined by a first direction DR1 and a second direction DR2 that cross each other. However, this is merely an example. For example, the electronic device EA may have various shapes and is not limited to any particular embodiment.

The electronic device EA may sense an external input TC. The external input TC may be of various types of inputs provided to the electronic device EA. Although the external input TC is exemplarily illustrated as a user's touch input in FIG. 1, it is understood that the input to the electronic device EA may be provided in various manners. For example, the input may include a non-touch external input (for example, hovering) that can be applied by placing a user's input to the proximity or adjacent within a predetermined distance to the electronic device EA as well as a touch input that can be applied by contacting a portion of the human body such as the user's hand. In addition, the input may be provided as various forms such as force, a pressure, light, and/or the like and is not limited to any particular embodiment.

The electronic device EA may include an electronic panel EP and a circuit board CB. A portion of the electronic device EA is selectively illustrated in FIG. 1 for ease of description. The electronic device EA may further include various other components such as a window member, a housing member, a power supply module, an optical member, a protection member, a heat dissipation member, an electronic module including electronic elements, and the like in addition to the electronic panel EP and the circuit board CB. In FIGS. 1 and 2A to 2C, those other components are omitted.

The electronic panel EP may be divided into an active area AA, a pad area PA, and a peripheral area NAA. The active area AA may correspond to an area on which the external input TC can be sensed. Although not shown, a plurality of sensing electrodes for sensing the external input TC may be disposed in the active area AA. The sensing electrodes will be described later in detail.

An image is displayed in the active area AA. Thus, the active area AA may include a plurality of light emitting areas PXA that provides light for generating the image. The light emitting areas PXA may be arranged in a matrix form in the active area AA.

A pixel may be disposed in each of the light emitting areas PXA. The pixel emits light according to an electrical signal. The pixel will be described later in detail.

The pad area PA may be disposed to be spaced apart from one side of the active area AA. A plurality of pads (not shown) may be disposed in the pad area PA. The pad area PA may correspond to an area of the electronic panel EP that is connected to the circuit board CB. The electronic panel EP may be electrically connected to an external device through the pad area PA.

In the present embodiment illustrated in FIG. 1, a single pad area PA is illustrated for easy of description. However, this is merely an example, and the electronic panel EP according to another embodiment of the inventive concept may include a plurality of pad areas. In addition, a plurality of electrical signals may be applied to the single pad area PA, or different electrical signals may be respectively applied to the plurality of pad areas PA.

The plurality of pad areas PA may be disposed on different layers or disposed on the same layer. The electronic panel EP according to an embodiment of the inventive concept may include various pad areas PA, but is not limited to any particular embodiment. In the present embodiment, the pad area PA through which a signal for sensing the external input TC is transmitted and received will be described as an example.

The peripheral are NAA is adjacent to the active area AA and the pad area PA. In the present embodiment, the peripheral are NAA may surround each of the active area AA and the pad area PA.

The circuit board CB may have one side that overlaps the pad area PA. The circuit board CB may provide an electrical signal to the electronic panel EP and/or receive an electrical signal that is generated from the electronic panel EP. The electrical signal may include an AC signal and/or a DC signal.

Although not shown, the circuit board CB may include a plurality of signal lines. Each of the signal lines may be connected to the pad area PA. The circuit board CB may further include an electronic element. The electronic element may include an electronic circuit.

Referring to FIGS. 2A and 2B, the circuit board CB may have a flexible property. For example, a portion of the circuit board CB overlapping the electronic panel EP may be connected to the pad area PA that is disposed on a front surface of the electronic panel EP, and a non-overlapping portion of the circuit board CB except for the overlapping portion may be folded to a rear surface of the electronic panel EP.

According to an embodiment of the inventive concept, the electronic panel EP may have a flexible property. The electronic panel EP may be folded with respect to a folding axis FX. In one embodiment, the folding axis FX is parallel to the first direction DR1. FIG. 2B illustrates the electronic panel EP that is in a folded state.

Referring back to FIG. 2A, the electronic panel EP may be spread from the folded state of FIG. 2B to an unfolded state so that the entire front surface of the active area AA is directed in the third direction DR3. As described above with respect to FIG. 1, the electronic panel EP may provide the active area AA and the peripheral area NAA on the front surface thereof. The active area AA may correspond to an area on which an image is displayed and also through which the external input TC is sensed. Duplicated description will be omitted.

Referring to FIG. 2B, the electronic panel EP may be folded into the folded state. In the folded state, the electronic panel EP may be folded to cover at least a portion of the active area AA. Thus, the electronic panel EP that is in the folded state may protect the active area AA.

According to the inventive concept, the electronic panel EP may be flexible to be folded in various shapes by an external force.

Referring to FIG. 2C, the electronic panel EP may include a bent area BA and a non-bent area NBA that is adjacent to the bent area BA. According to an embodiment, the non-bent area NBA may correspond to the peripheral area NAA on which the circuit board CB is disposed. The electronic panel EP may be folded with respect to the folding axis FX. Thus, the circuit board CB may be disposed to be adjacent to a bottom surface of the electronic panel EP.

The example shown in FIG. 2C illustrates that the folded shape of the electronic panel EP may vary according to the folding axis FX, but it is understood that the present disclosure is not limited to any particular embodiment. In one embodiment, the electronic panel EP may be folded with respect to two or more folding axes FX, and the folding axes FX may not be parallel to each other.

Figure 3:
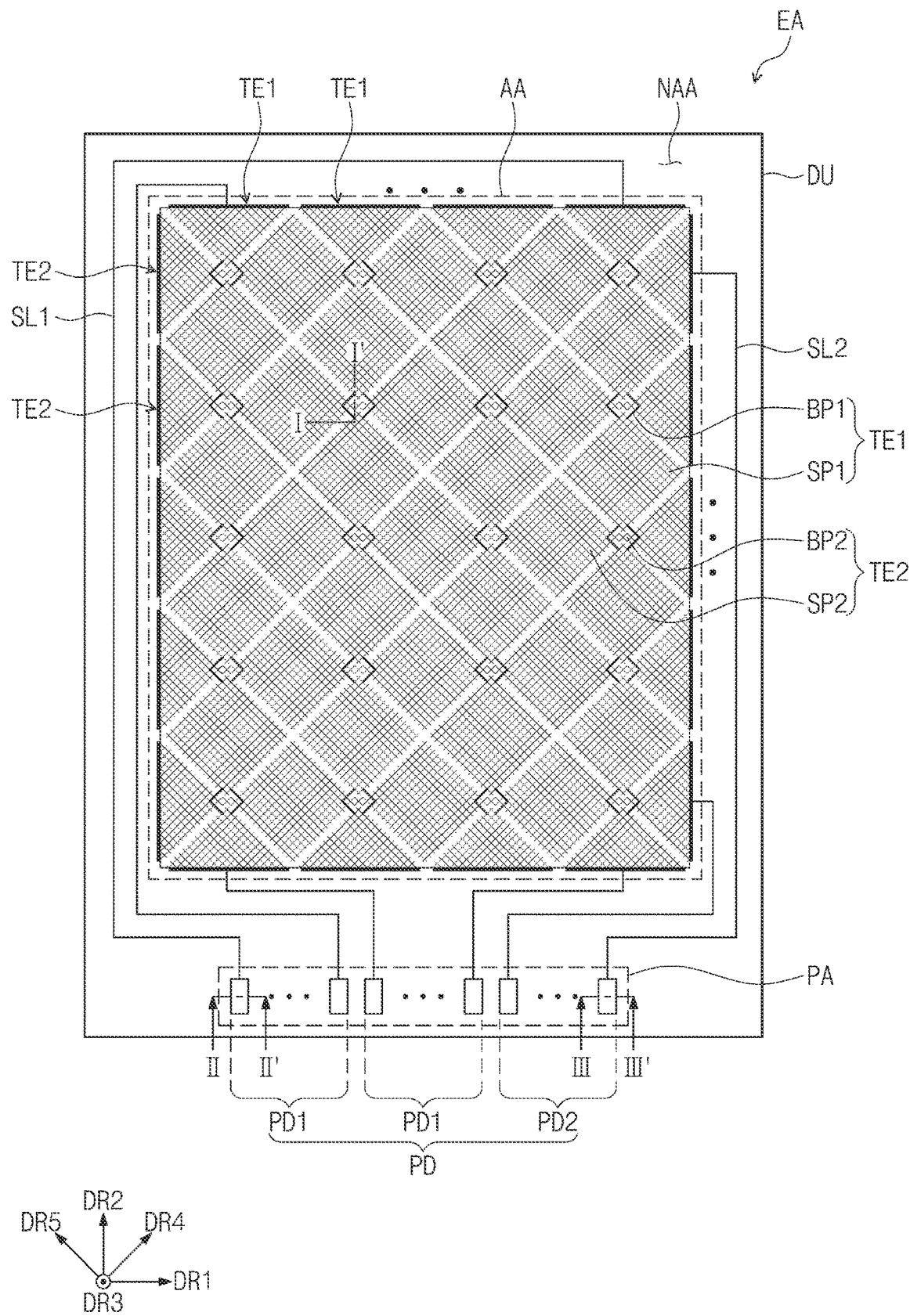
FIG. 3 is a schematic plan view of the electronic panel according to an embodiment of the inventive concept.
Figure 4A:
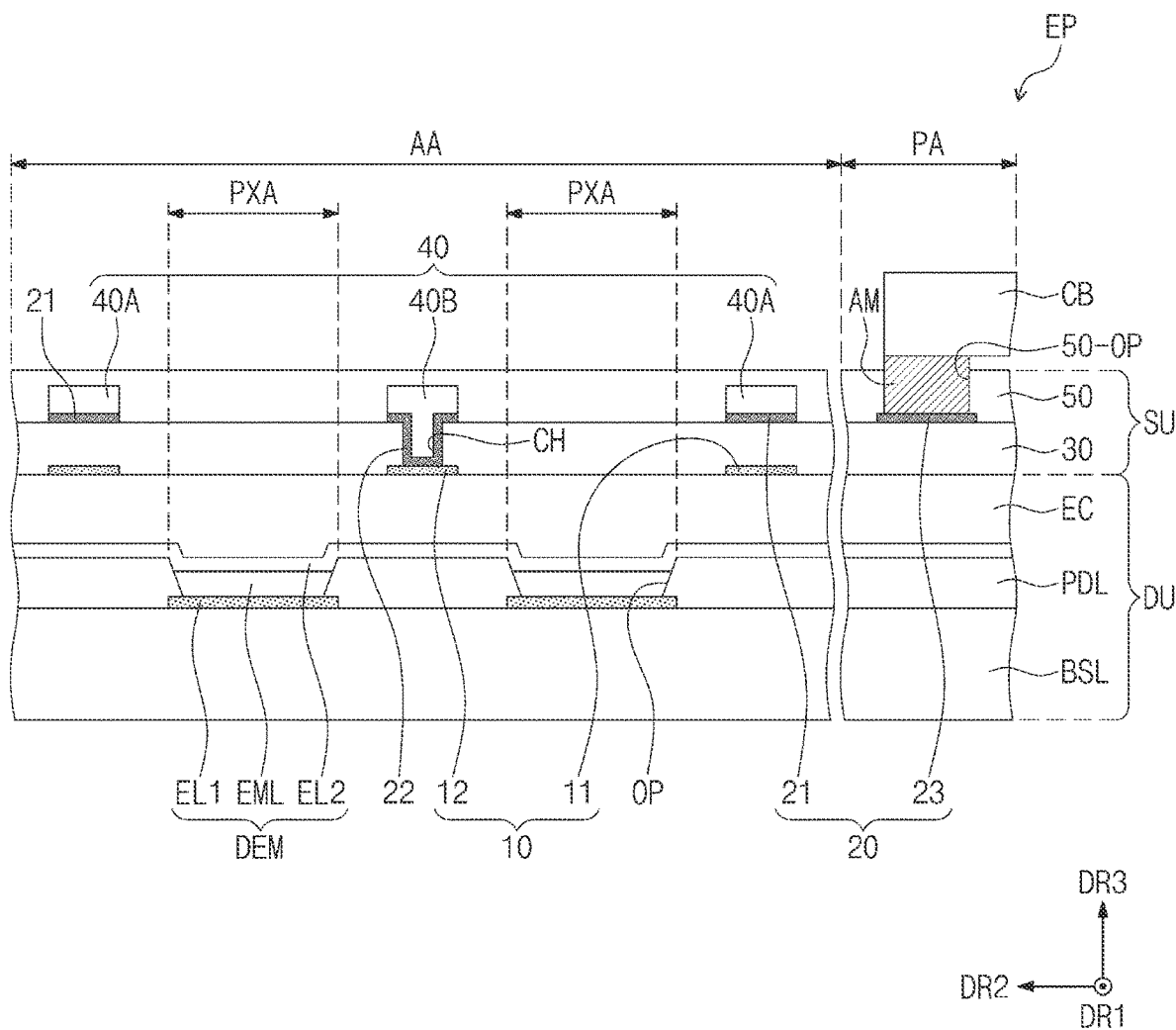
FIG. 4A is a cross-sectional view illustrating a portion of an area of the electronic panel of FIG. 3.
Figure 4B:
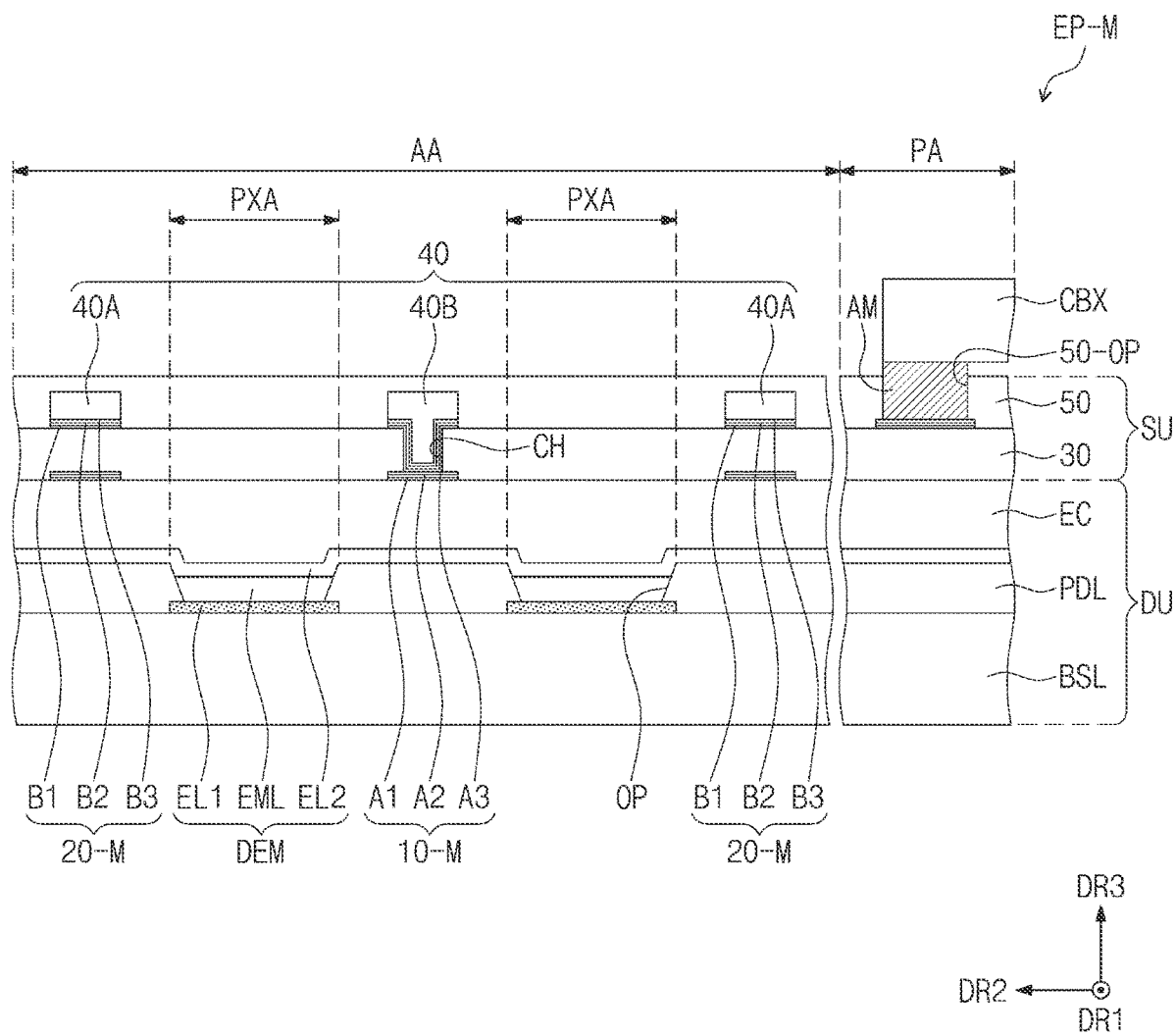
FIG. 4B is a cross-sectional view illustrating a portion of the area of the electronic panel according to an embodiment of the inventive concept.

FIG. 3 is a schematic plan view of the electronic panel according to an embodiment of the inventive concept. FIG. 4A is a cross-sectional view illustrating a portion of an area of the electronic panel of FIG. 3; FIG. 4B is a cross-sectional view illustrating a portion of the area of the electronic panel according to an embodiment of the inventive concept.

For convenience of description, FIG. 4A illustrates portions of the active area AA and the pad area PA, and FIG. 4B illustrates an area corresponding to that of FIG. 4A. Hereinafter, the present disclosure will be described with reference to FIGS. 3 to 4B.

Referring to FIGS. 3 and 4A, the electronic panel EP includes a display member DU and an input sensing member SU. In this embodiment, the input sensing member SU is disposed on the display member DU. However, this is merely an example. For example, the input sensing member SU may be disposed below the display member DU or be integrated into the display member DU. The position of the input sensing member SU with respect to the display member UD may vary, and is not limited to any particular embodiment.

Referring to FIG. 4A, the display member DU may include a base layer BSL, a pixel defining layer PDL, a display element DEM, and an encapsulation layer EC. The display member DU may include the light emitting areas PXA that are arranged in the active area AA. FIG. 4A illustrates an area including two light emitting areas PXA.

Although not shown, the base layer BSL may include one or more insulation layers and one or more conductive layers. The one or more conductive layers and the one or more insulation layers may form a thin film transistor (not shown) and a capacitor (not shown) that are connected to the display element DEM.

The pixel defining layer PDL may be disposed on the base layer BSL. Openings OP corresponding to the light emitting areas PXA are defined in the pixel defining layer PDL.

The display element DEM may be disposed on the base layer BSL. The display element DEM may be disposed in each of the openings OP. The display device DEM generates light according to the electrical signal transmitted through the thin film transistor and the capacitor to display an image.

The structure and the principle of operation of the display element DEM may vary according to the type of the display element DEM. For example, the display element DEM may be an electrophoretic display element, a liquid crystal display element, an electrowetting display element, or an organic light emitting display element. In the present embodiment, the organic light emitting display element will be described as an example of the display element DEM.

The display element DEM includes a first electrode EL1, a light emitting layer EML, and a second electrode EL2. The display element DEM may activate the light emitting layer EML according to a potential difference between the first electrode EL1 and the second electrode LE2 to generate light. Thus, the light emitting areas PXA may correspond to an area on which the light emitting layer EML is disposed.

The light emitting areas PXA may have non-uniform sizes. For example, the light emitting areas PXA may have different sizes according to colors of light emitted therefrom. Since the electronic panel EP includes the light emitting areas PXA having areas adequate for the different colors, the electronic panel EP may have a uniform light efficiency with respect to various colors.

The encapsulation layer EC is disposed on the display element DEM. The encapsulation layer EC may include at least one inorganic layer and/or at least one organic layer. The encapsulation layer EC may protect moisture from permeating into the display element DEM to protect the display element DEM. In addition, the encapsulation layer EC may be disposed between the display element DEM and the input sensing member SU to electrically separate the display element DEM from the input sensing member SU from each other.

The input sensing member SU may be directly disposed on the encapsulation layer EC. For example, the input sensing member SU may be deposited or patterned on a top surface of the encapsulation layer EC. However, this is merely an example. For example, the electronic device EA may further include an intervening member (not shown) such as a color filter or a buffer layer that is disposed between the input sensing member SU and the encapsulation layer EC.

Referring to FIG. 3, the input sensing member SU may include a first sensing electrode TE1, a second sensing electrode TE2, a first signal line SL1, a second signal line SL2, and a plurality of pads PD. The first sensing electrode TE1, the second sensing electrode TE2, the first signal line SL1, the second signal line SL2, and the pads PD are herein collectively referred to as conductive patterns of the input sensing member SU.

The first sensing electrode TE1 may extend in the second direction DR2. The first sensing electrode TE1 may be provided in plurality and arranged in columns along the first direction DR1. The first sensing electrode TE1 includes a plurality of first sensor patterns SP1 that is arranged in the second direction DR2 and first connection patterns BP1 that are disposed between adjacent first sensor patterns SP1 to connect the adjacent first sensor patterns SP1 to each other.

The second sensing electrode TE2 may be disposed to be insulated from the first sensing electrode TE1. The second sensing electrode TE2 may extend in the first direction DR1. The second sensing electrode TE2 may be provided in plurality and arranged in rows along the second direction DR2. The second sensing electrode TE2 includes a plurality of second sensor patterns SP2 that is arranged in the first direction DR1 and second connection patterns BP2 that are disposed between adjacent second sensor patterns SP2 to connect the adjacent second sensor patterns SP2 to each other.

The input sensing member SU may sense a variation in mutual capacitance between the first sensing electrode TE1 and the second sensing electrode TE2 or sense a variation in self capacitance of each of the first sensing electrode TE1 and the second sensing electrode TE2 to sense the external input TC (see FIG. 1A). The input sensing member SU according to an embodiment of the inventive concept may sense the external input TC in various manners, but is not limited to any particular embodiment.

The first signal line SL1 is connected to the first sensing electrode TEL The first signal line SL1 may be disposed in the peripheral area NAA. The second signal line SL2 is connected to the second sensing electrode TE2. The second signal line SL2 may be disposed in the peripheral area NAA.

In the present embodiment, one first sensing electrode TE1 may be connected to two first signal lines SL1. For example, one end of the one first sensing electrode TE1 and the other end of the one first sensing electrode TE1 may be connected to the two first signal lines SL1 that are respectively connected to two first pads. Thus, even though the first sensing electrode TE1 may have a relatively long length when compared to that of the second sensing electrode TE2, the electrical signal may be uniformly applied to the entire active area AA reducing or minimizing a signal delay. Thus, the input sensing member SU may provide a uniform external input sensing throughout the entire active area AA regardless of the shape and/or size of the active area AA.

However, this is merely an example. For example, the second sensing electrode TE2 may also be connected to the two second signal lines SL2. Alternatively, each of the first sensing electrode TE1 and the second sensing electrode TE2 may be connected to only one signal line SL1 and SL2, respectively. The input sensing member SU according to an embodiment of the inventive concept may be driven in various manners, but is not limited to any particular embodiment.

The pads PD may include a first pad PD1 and a second pad PD2. As described above, each of the pads PD may be connected to the first signal line SL1 or the second signal line SL2 and thus may be electrically connected to the first sensing electrode TE1 or the second sensing electrode TE2. An external terminal provided through the circuit board CB (see FIG. 1) may be connected to the pads PD to electrically connect the input sensing member SU to an external device or component.

Referring to FIG. 4A, the input sensing member SU may include a plurality of conductive patterns and a plurality of insulation layers that are laminated on a cross-section thereof. The conductive patterns may be divided into a first conductive layer 10 and a second conductive layer 20 that are disposed on layers different from each other. The insulation layer may include a first insulation layer 30, a second insulation layer 40, and a third insulation layer 50 that are disposed on layers different from each other.

The first sensing electrode TE1, the second sensing electrode TE2, the first signal line SL1, the second signal line SL2, and the pads PD that are illustrated in FIG. 3 may be formed by the conductive patterns 10 and 20. In FIG. 3, for convenience of description, the first insulation layer 30, the second insulation layer 40, and the third insulation layer 50 are not shown.

The first conductive layer 10 is disposed on the display member DU. The first conductive layer 10 may include a plurality of first conductive patterns 11 and 12. Each of the first conductive patterns 11 and 12 may form one of the first sensing electrode TE1, the second sensing electrode TE2, the first signal line SL1, the second signal line SL2, and the pads PD that are described above.

The first conductive patterns 11 and 12 may include a first pattern 11 and a second pattern 12. The first pattern 11 and the second pattern 12 may be disposed on the same layer and have the substantially similar shape. A top surface of the first pattern 11 is covered by the first insulation layer 30. A portion of a top surface of the second pattern 12 may contact the second conductive layer 20.

The second conductive layer 20 may be disposed on the first conductive layer 10. The second conductive layer 20 includes a plurality of second conductive patterns 21 and 22 and a connection pattern 23. Each of the second conductive patterns 21 and 22 may form one of the first sensing electrode TE1, the second sensing electrode TE2, the first signal line SL1, and the second signal line SL2 that are described above. The connection pattern 23 may form one of the pads PD.

The second conductive patterns 21 and 22 may include a third pattern 21 and a fourth pattern 22. The third pattern 21 and the fourth pattern 22 may be disposed in the active area AA. The connection pattern 23 may be disposed on the pad area PA.

The third pattern 21, the fourth pattern 22, and the connection pattern 23 may have different shapes. The third pattern 21 may be disposed on the first insulation layer 30 and spaced apart from the first conductive layer 10. The fourth pattern 22 may pass through the first insulation layer 30 to contact the first conductive layer 10. More specifically, the top surface of the second pattern 12 may contact a bottom surface of the fourth pattern 22. A portion of a top surface of the connection pattern 23 may be exposed by an opening 50-OP of the third insulation layer 50.

However, this is merely an example. For example, the input sensing member SU according to another embodiment of the inventive concept may not include the second pattern 12 and the fourth pattern 22. In this case, the first conductive layer 10 may include only the first patterns 11, and the second conductive layer 20 may include only the third patterns 21 and the connection pattern 23.

Each of the first conductive patterns 11 and 12 and the second conductive patterns 21 and 22 may be disposed in an area that overlaps the pixel defining layer PDL without overlapping the light emitting areas PXA. Thus, even though each of the first conductive layer 10 and the second conductive layer 20 according to an embodiment of the inventive concept is made of an opaque material or has a wide area in a plan view, the first conductive layer 10 and the second conductive layer 20 may not affect an image displayed in each of the light emitting areas PXA. However, this is merely an example. For example, each of the first conductive layer 10 and the second conductive layer 20 may be disposed to overlap at least a portion of the light emitting areas PXA, but the present disclosure is not limited thereto.

The first insulation layer 30 is disposed between the first conductive layer 10 and the second conductive layer 20. The first insulation layer 30 spaces and separates the first conductive layer 10 from the second conductive layer 20 in the cross-sectional view. A portion of the first conductive layer 10 and the second conductive layer 20 may be electrically connected through a contact hole CH that passes through the first insulation layer 30. In the present embodiment illustrated in FIG. 4A, the first pattern 11 and the third pattern 21 may be spaced apart from each other with the first insulation layer 30 interposed therebetween, and the second pattern 12 and the fourth pattern 22 may be electrically connected to each other through the contact hole CH.

The first insulation layer 30 may be optically transparent. In the present embodiment, the first insulation layer 30 may include an organic material. Thus, the input sensing member SU may have flexibility to be folded, rolled, or bent. Hereinafter, the first insulation layer 30 may be also referred to as a first organic insulation layer 30.

The second insulation layer 40 (hereinafter also referred to as a pattern layer 40) according to the inventive concept may include organic patterns 40A and 40B. The organic patterns 40A and 40B may be disposed to overlap the third pattern 21 and the fourth pattern 22 of the second conductive layer 20. The organic patterns 40A and 40B may be disposed to overlap the pixel defining layer PDL without overlapping the light emitting areas PXA.

The third insulation layer 50 may be disposed on the pattern layer 40. The third insulation layer 50 covers the pattern layer 40 and the second conductive layer 20. However, the third insulation layer 50 may not overlap the connection pattern 23 that is disposed in the pad area PA. The opening 50-OP through which at least a portion of the connection pattern 23 is exposed may be defined in the third insulation layer 50.

The circuit board CB may be connected to the connection pattern 23 that is exposed through the third insulation layer 50. A connection member AM may be provided in the opening 50-OP to electrically connect a pad that is defined by the connection pattern 23 of the second conductive layer 20 to the circuit board CB. Thus, the connection pattern 23 that is exposed through the third insulation layer 50 may contact and electrically connect to the circuit board CB via the connection member AM.

The third insulation layer 50 may include an insulation material. The third insulation layer 50 may include an organic material and/or an inorganic material. When the third insulation layer 50 includes the organic material, the input sensing member SU may impart improved flexibility. When the third insulation layer 50 includes the inorganic material, the input sensing member SU may be provided to have a thin film shape and improved impact resistance. When the third insulation layer 50 includes the organic layer, the pattern layer 40 may include the same material as the third insulation layer 50. In another embodiment, the third insulation layer 50 may include the same material as the first organic insulation layer 30. In yet another embodiment, the first organic insulation layer 30, the pattern layer 40, and the third insulation layer 50 may include the same material. Hereinafter, the third insulation layer 50 may also be referred to as a second organic insulation layer 50.

The second organic insulation layer 50 according to an embodiment of the inventive concept may include various materials, but is not limited to any particular embodiment. Hereinafter, the second organic insulation layer 50 including the organic material will be described.

Referring to FIG. 4B, an electronic panel EP-M may include a first conductive layer 10-M and a second conductive layer 20-M, each of which may include a plurality of layers. The first conductive layer 10-M may include a first layer A1, a second layer A2, and a third layer A3 that are sequentially laminated in the third direction DR3.

The first layer A1, the second layer A2, and the third layer A3 may include the same material or materials that are different from each other. The first conductive layer 10-M may include a plurality of layers to improve process reliability. In addition, the first conductive layer 10-M may reduce an internal resistance to improve electrical properties.

The second conductive layer 20-M may include a first layer B1, a second layer B2, and a third layer B3 that are sequentially laminated in the third direction DR3. The first layer B1, the second layer B2, and third layer B3 may include the same material or materials that are different from each other. The material(s) of the first layer B1, the second layer B2, and third layer B3 may be the same material or different from those of the first layer A1, the second layer A2, and the third layer A3.

Each of the electronic panels EP and EP-M according to an embodiment of the inventive concept may include a pattern layer 40 that exposes a portion of a top surface of the first organic insulation layer 30 and covers the second conductive layer 20. Thus, each of the electronic panels EP and EP-M may include a layer that is capable of protecting the top surface of the second conductive layer 20 without interfering with the flexibility of the first organic insulation layer 30 to improve the process reliability thereof. These advantages of the electronic panels EP and EP-M will be described later in detail.

Figure 5:
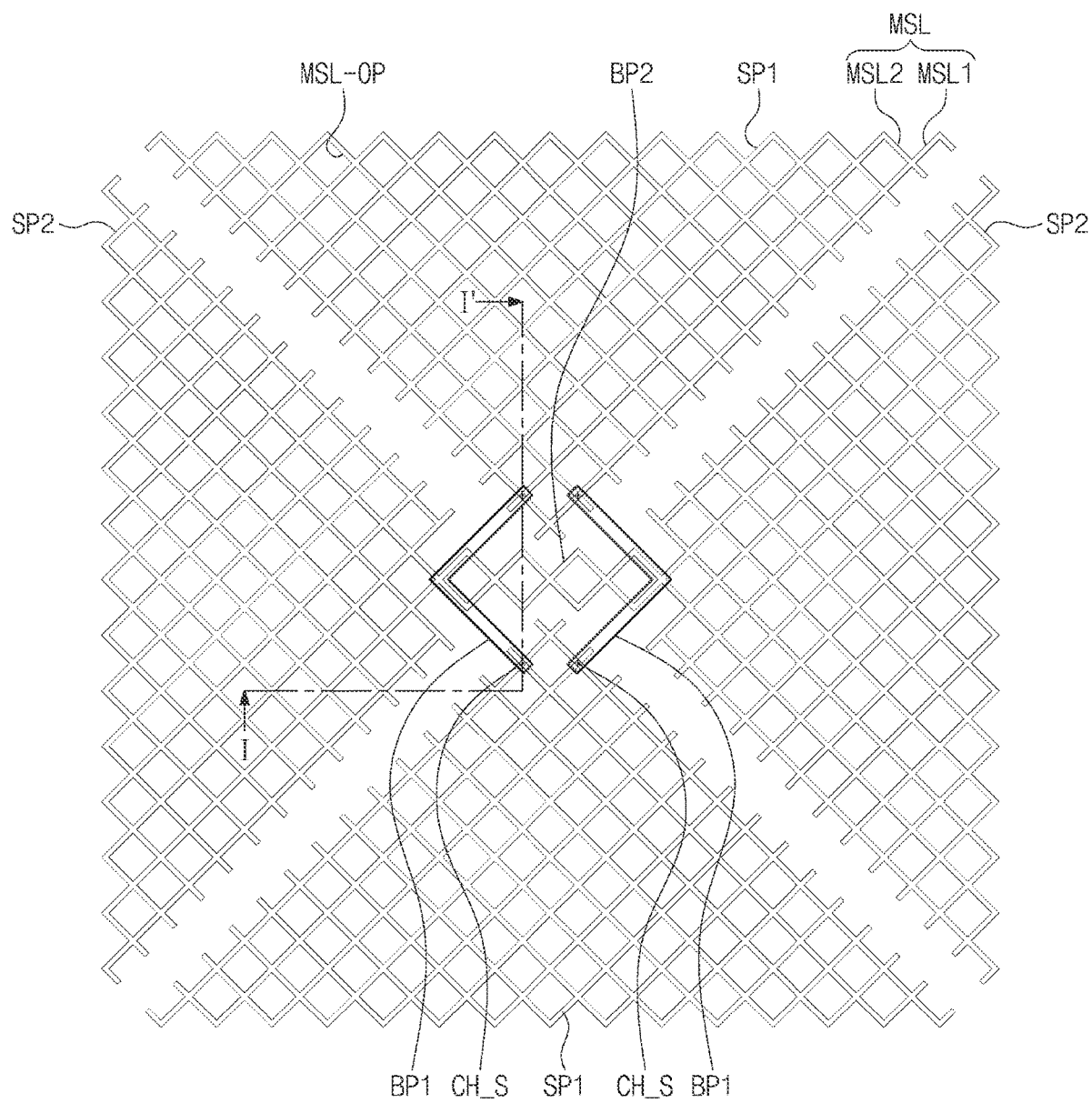
FIG. 5 is an enlarged plan view illustrating a portion of the area illustrated in FIG. 3.

FIG. 5 is an enlarged plan view illustrating a portion of the area illustrated in FIG. 3. FIG. 5 is an enlarged view illustrating an area in the vicinity of the line I-I' of FIG. 3. For convenience of description, only the conductive patterns forming the input sensing member SU is illustrated in FIG. 5, and the first, second, and third insulation layers 30, 40, and 50 (see FIG. 4A) are not shown.

As illustrated in FIG. 5, the conductive patterns may include a plurality of mesh lines MSL. The mesh lines MSL includes a first mesh line MSL1 extending in a fourth direction DR4 and a second mesh line MSL2 extending in a fifth direction DR5 to cross the first mesh line MSL1. The first mesh line MSL1 and the second mesh line MSL2 may form a mesh opening MSL-OP.

Each of the above-described first and second conductive patterns 11, 12, 13, and 14 may correspond to a portion of the mesh lines MSL. A top surface of the first conductive layer 10 or a top surface of the second conductive layer 20 may correspond to a top surface of each of the mesh lines MSL.

The plurality of first sensor patterns SP1 may be disposed to be spaced apart from each other in the second direction DR2, and the plurality of second sensor patterns SP2 may be disposed to be spaced apart from each other in the first direction DR1. A second connection pattern BP2 may extend in the first direction DR1 to connect adjacent second sensor patterns SP2 to each other. In the present embodiment, each of the second sensor patterns SP2 and the second connection pattern BP2 may include the mesh lines MSL and be integrated with the mesh lines MSL.

Adjacent first sensor patterns SP1 may be connected to each other by the first connection pattern BP1 that extends in the fourth direction DR4 and the fifth direction DR5. The first connection pattern BP1 and the second connection pattern BP2 may be disposed on layers that are different from each other. In the present embodiment, the first connection pattern BP1 may be disposed on a layer that is different from the layers of the first sensor patterns SP1, the second sensor patterns SP2, and the second connection pattern BP2.

The first connection pattern BP1 may be formed by the mesh lines MSL or provided as a transparent pattern. In addition, the first connection pattern BP1 according to an embodiment of the inventive concept may be disposed on the same layer as the first sensor patterns SP1. Here, the first sensor patterns SP1 and the second sensor patterns SP2 may be disposed on layers that are different from each other, and the first connection pattern BP1 may be integrated with the first sensor patterns SP1.

Figure 6A:
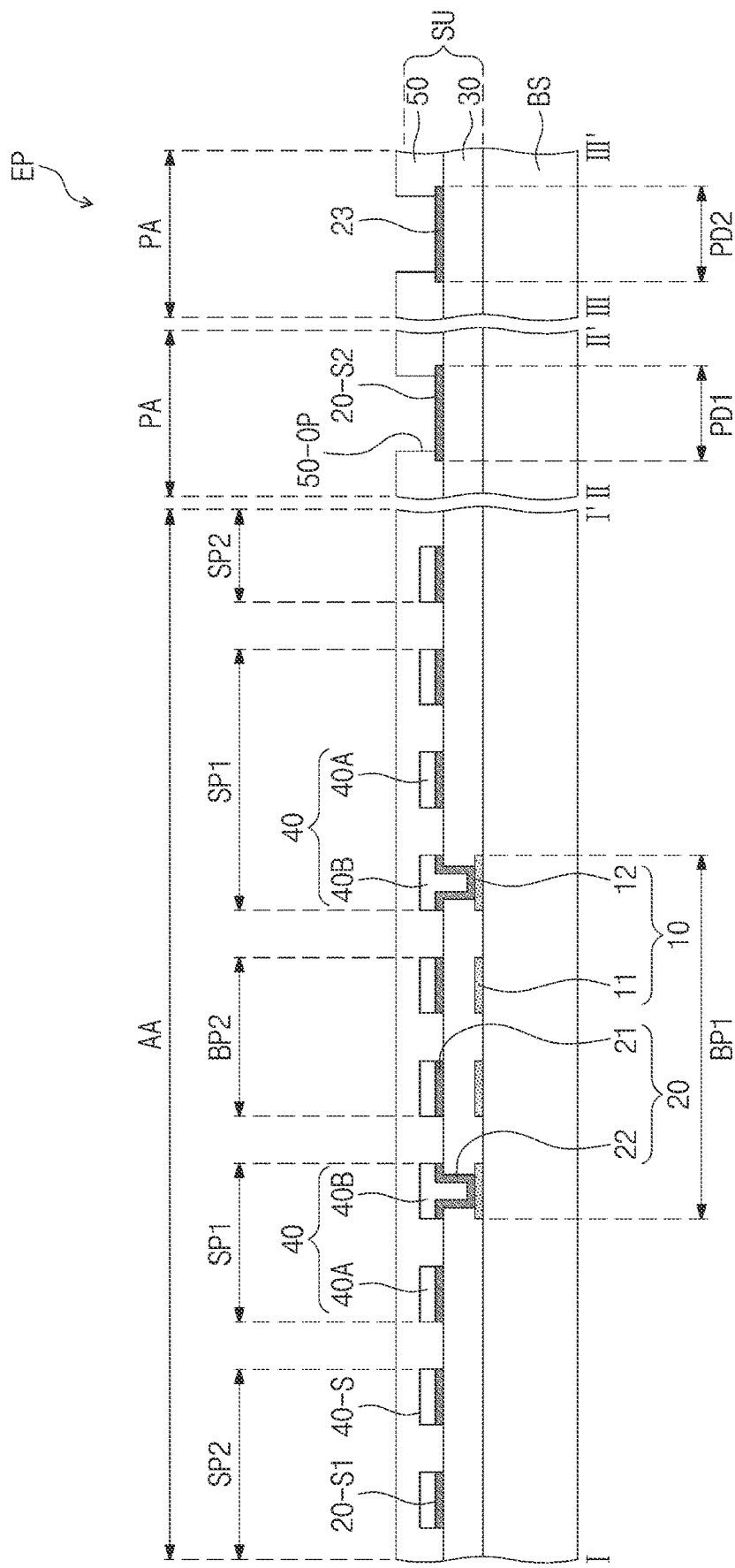
FIGS. 6A to 6C are cross-sectional views illustrating a portion of electronic panels according to an embodiment of the inventive concept.
Figure 6B:
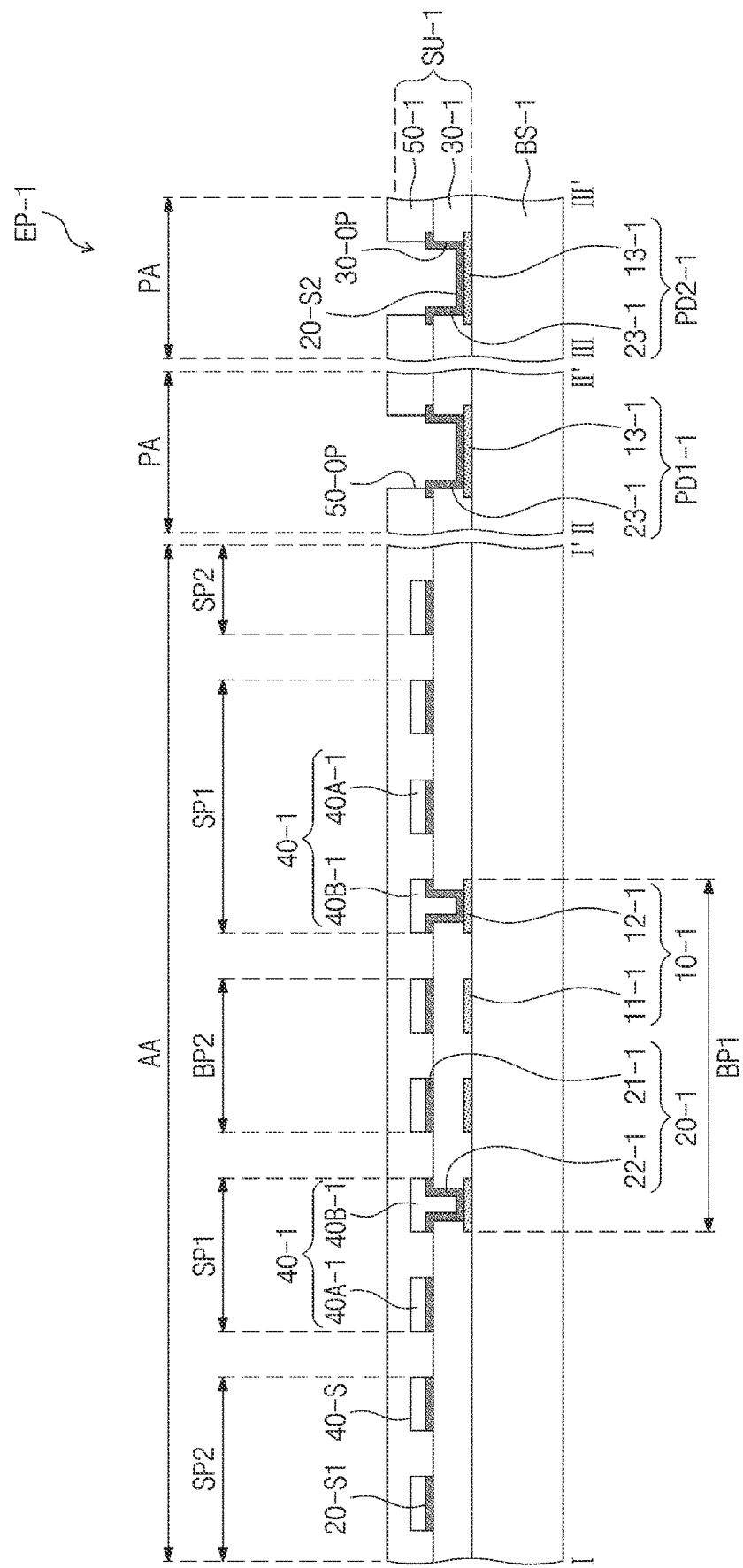
Figure 6C:
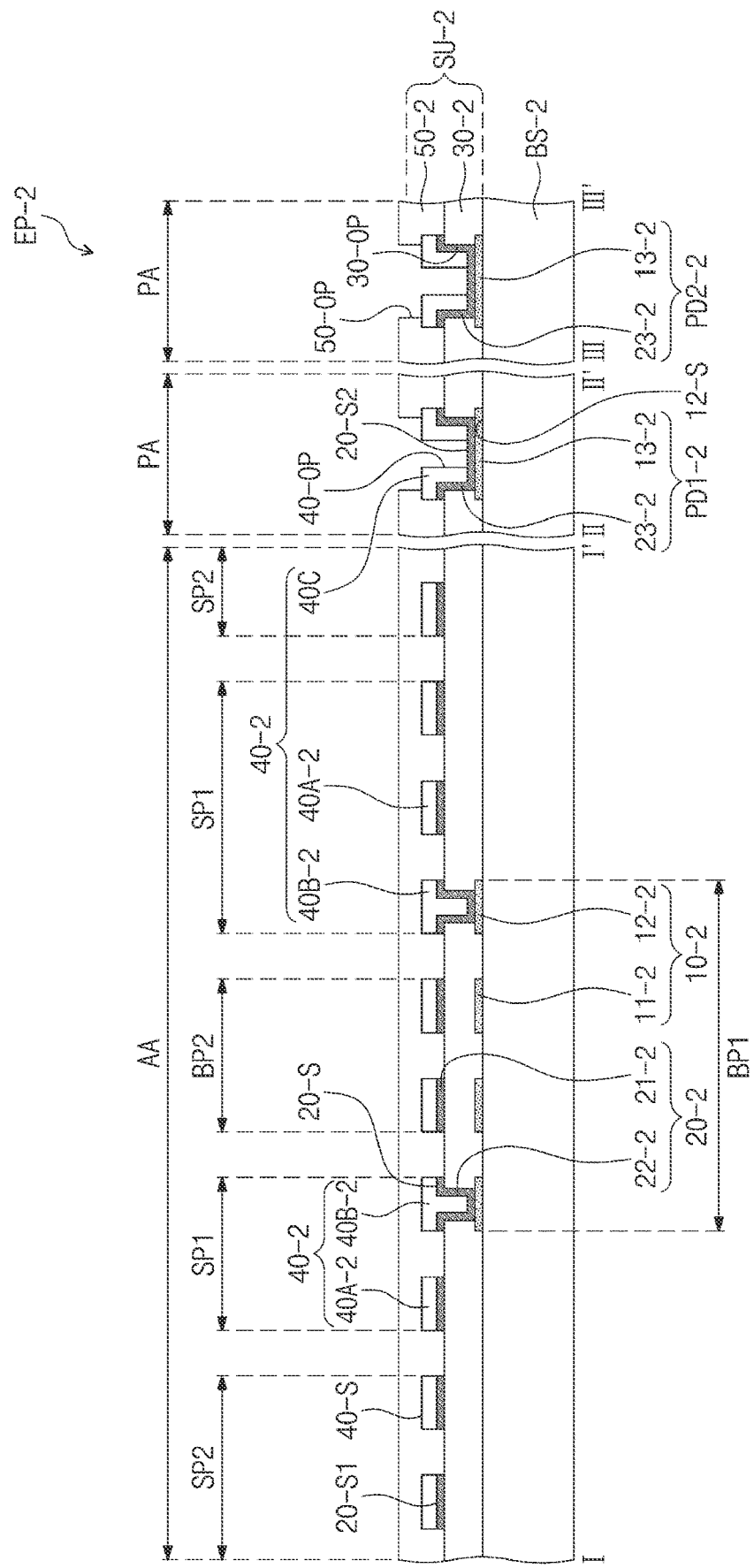

The first sensor patterns SP1, the second sensor patterns SP2, the first connection pattern BP1, and the second connection pattern BP2 according to an embodiment of the inventive concept may be formed in the first conductive layer 10 (see FIG. 4A) and the second conductive layer 20 (see FIG. 4A) through various non-limiting combinations. The pattern layer 40 may cover the top surfaces of the mesh lines MSL that form the second conductive layer 20 and expose a top surface of the first organic insulation layer 30 (see FIG. 4A) that is exposed by the mesh openings MSL-OP. FIG. 6A illustrates areas taken along line I-I', II-II', and III-III' of FIG. 3, and FIGS. 6B and 6C illustrate areas corresponding to those of FIG. 6A.

The line I-I' of FIG. 3 may correspond to the line I-I' of FIG. 5. Thus, each of the first conductive patterns 11 and 12 and the second conductive patterns 21 and 22 may correspond to a respective portion of the mesh lines MSL.

Hereinafter, the electronic panels EP, EP-1, and EP-2 according to an embodiment of the inventive concept will be described with reference to FIGS. 6A to 6C, respectively. The same reference numeral may be given to components that are the same as those of FIGS. 1 to 5, and their detailed descriptions will be omitted.

Referring to FIG. 6A, the electronic panel EP may include the base substrate BS and the input sensing member SU. The base substrate BS may correspond to the above-described display member DU. However, this is merely an example. For example, the base substrate BS may be an insulation substrate. Here, the electronic panel EP may not display an image in the active area AA and may sense only an input through the active area AA (the external input TC, see FIG. 1A) The electronic panel EP according to an embodiment of the inventive concept may include various embodiments, but the present disclosure is not limited to any particular embodiment.

As illustrated in FIG. 6A, the electronic panel EP may include the first connection pattern BP1 that is disposed below the second connection pattern BP2. Here, the first conductive layer 10 may include the first connection pattern BP1.

The first conductive patterns 11 and 12 may be formed by the first connection pattern BP1. Thus, the first conductive patterns 11 and 12 of FIG. 6A may be connected to each other in different directions (not shown).

The first sensor patterns SP1, the second sensor patterns SP2, and the second connection pattern BP2 may be disposed in the same layer. The first sensor patterns SP1, the second sensor patterns SP2, and the second connection pattern BP2 may be disposed on the first connection pattern BP1. In other words, the second conductive layer 20 may include the first sensor patterns SP1, the second sensor patterns SP2, and the second connection pattern BP2.

The second conductive patterns 21 and 22 may form the first sensor patterns SP1, the second sensor patterns SP2, and the second connection pattern BP2. In the present embodiment, the second sensor patterns SP2 and the second connection pattern BP2 may be formed by the third pattern 21 of the second conductive patterns 21 and 22, and the first sensor patterns SP1 may be formed by the third pattern 21 and the fourth pattern 22.

As described above, the third pattern 21 may be disposed to be spaced apart from the first conductive layer 10 in a cross-sectional view. The third pattern 21 may be disposed on the top surface of the first organic insulation layer 30 and thus may not be directly connected to the first conductive layer 10.

The fourth pattern 22 may be pass through the first organic insulation layer 30 of the second conductive layer 20. The fourth pattern 22 may be connected to the second pattern 12 of the first conductive layer 10. The fourth pattern 22 may be directly connected to the second pattern 12 of the first conductive layer 10.

In the present embodiment, the second conductive layer 20 may further include a first pad PD1 and a second pad PD2. Each of the first pad PD1 and the second pad PD2 may be formed by the connection patterns 23. In this embodiment, each of the first pad PD1 and the second pad PD2 may include the connection pattern 23.

The first organic insulation layer 30 may be disposed between the first conductive layer 10 and the second conductive layer 20. The first organic insulation layer 30 may overlap the active area AA and the pad area PA in a plan view. The first organic insulation layer 30 may extend from the active area AA to overlap at least a portion of the pad area PA. Thus, the connection patterns 23 that are disposed in the pad area PA may be disposed on the first organic insulation layer 30.

The pattern layer 40 may be disposed to overlap the second conductive layer 20. The organic patterns 40A and 40B may contact top surfaces 20-S1 of the first sensor patterns SP1, the second sensor patterns SP2, and the second connection pattern BP2. The organic patterns 40A and 40B may not overlap portions of the top surface of the first organic insulation layer 30 that are exposed by the second conductive patterns 21 and 22.

The second organic insulation layer 50 may be disposed on the pattern layer 40. The second organic insulation layer 50 may cover the portions of the top surface of the first organic insulation layer 30 that are exposed by the second conductive patterns 21 and 22.

The second organic insulation layer 50 may cover the pad area PA. The third insulation layer 50 that overlaps the connection pattern 23 may have an opening 50-OP exposing a portion of the connection pattern 23.

Referring to FIG. 6B, the electronic panel EP-1 may include pads PD1-1 and PD2-1 including a plurality of conductive patterns. An input sensing member SU-1 of the electronic panel EP-1 may include a first conductive layer 10-1, a second conductive layer 20-1, a first organic insulation layer 30-1, a pattern layer 40-1, and a second organic insulation layer 50-1. The first conductive layer 10-1 may include first conductive patterns 11-1 and 12-1 forming the first connection pattern BP1 and a lower connection pad 13-1 that is disposed in the pad area PA.

The first organic insulation layer 30-1 may further include an opening 30-OP defined in the pad area PA exposing at least a portion of the lower connection pad 13-1. A connection pattern 23-1 may be disposed in the pad area PA to overlap the lower connection pad 13-1. The connection pattern 23-1 may be connected to the lower connection pad 13-1 through the opening 30-OP defined in the first organic insulation layer 30-1. Thus, each of the pads PD1-1 and PD2-1 may include the lower connection pad 13-1 and the connection pattern 23-1.

The electronic panel EP-1 including the plurality of conductive patterns may reduce an internal resistance to improve electrical properties.

Referring to FIG. 6C, a pattern layer 40-2 of the electronic panel EP-2 may further include a pad pattern layer 40C that is disposed in the pad area PA.

The electronic panel EP-2 may include pads PD1-2 and PD2-2 including a plurality of conductive patterns. An input sensing member SU-2 of the electronic panel EP-2 may include a first conductive layer 10-2, a second conductive layer 20-2, a first organic insulation layer 30-2, a pattern layer 40-2, and a second organic insulation layer 50-2. The first conductive layer 10-2 may include first conductive patterns 11-2 and 12-2 forming the first connection pattern BP1 and a lower connection pad 13-2 that is disposed in the pad area PA.

The first organic insulation layer 30-2 may further include an opening 30-OP defined in the pad area PA exposing at least a portion of the lower connection pad 13-2. A connection pattern 23-2 is disposed in the pad area PA to overlap the lower connection pad 13-2. The connection pattern 23-2 may be connected to the lower connection pad 13-2 through the opening 30-OP defined in the first organic insulation layer 30-2. Thus, each of the pads PD1-2 and PD2-2 may include the lower connection pad 13-2 and the connection pattern 23-2.

The pad pattern layer 40C may be disposed between the connection pattern 23-2 and the second organic insulation layer 50-2. The pad pattern layer 40C may have an opening 40-OP through which a portion of a top surface 20-S2 of the connection pattern 23-2 is exposed. The opening 40-OP of the pad pattern layer 40C may overlap an opening 50-OP of the second organic insulation layer 50-2. Thus, the top surface 20-S2 of the connection pattern 23-2 may be exposed by the opening 40-OP of the pad pattern layer 40C and the opening 50-OP of the second organic insulation layer 50-2.

Figure 7:
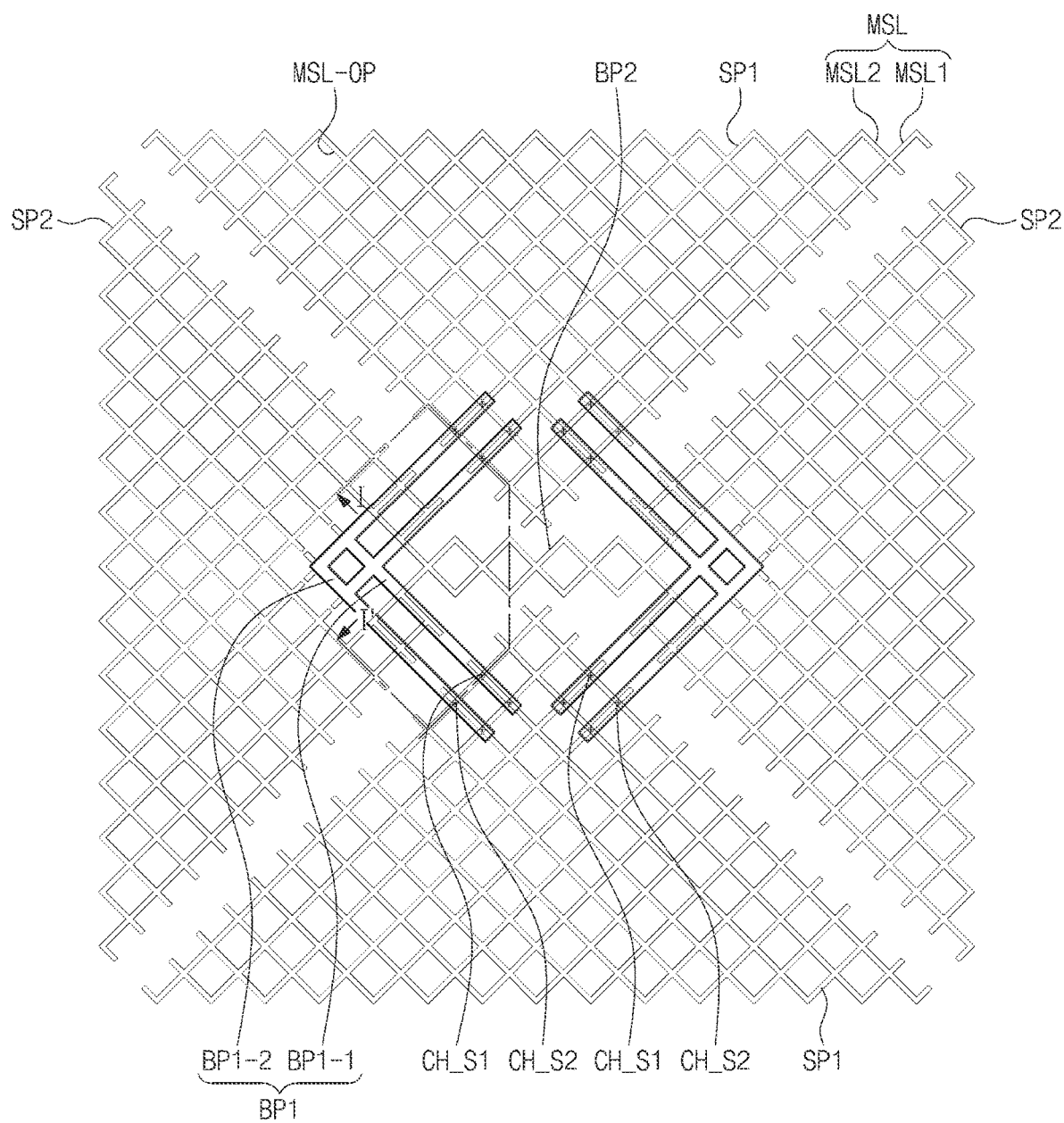
FIG. 7 is an enlarged plan view illustrating a portion of the area of the electronic panel according to an embodiment of the inventive concept.
Figure 8:
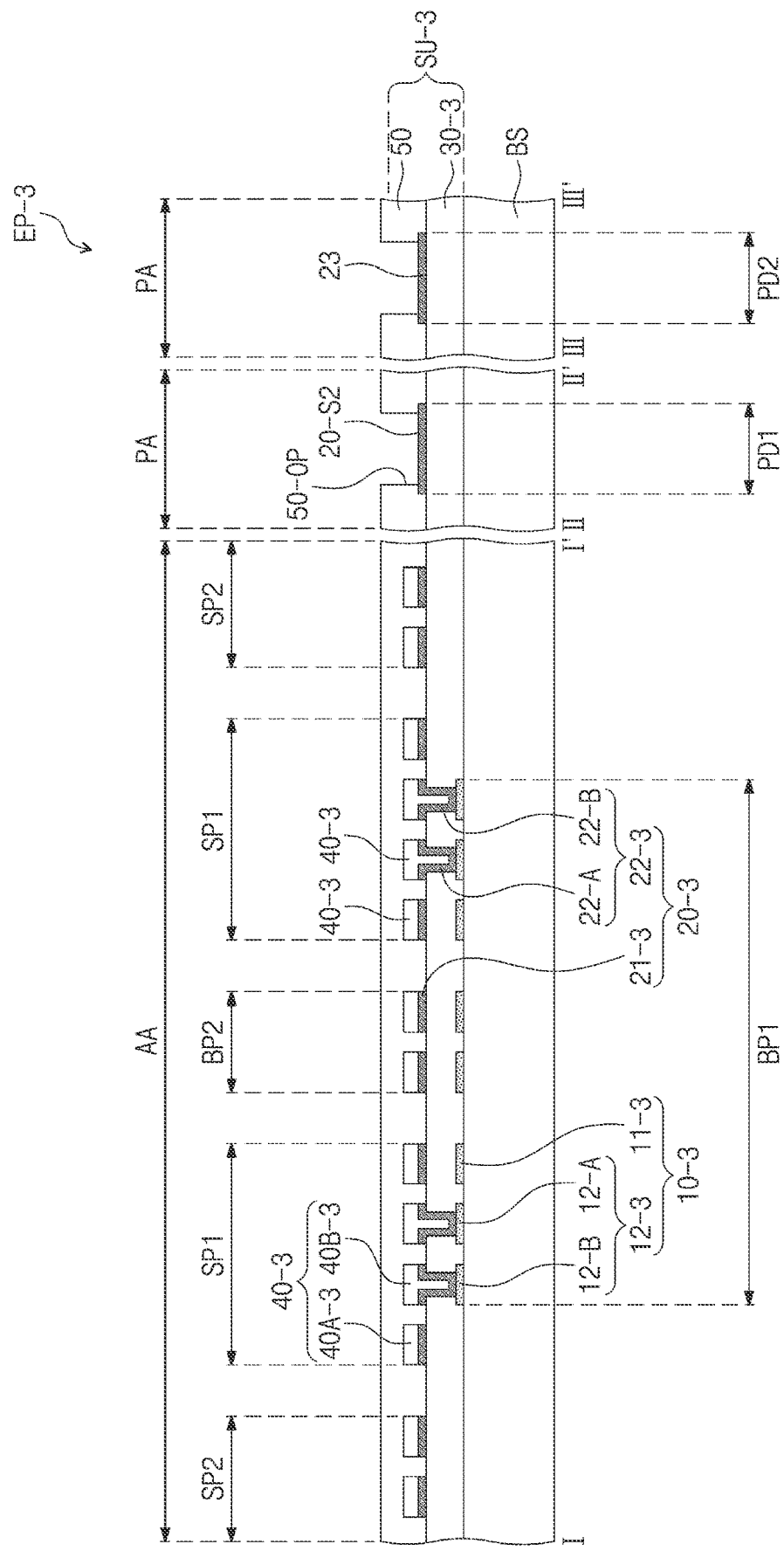
FIG. 8 is a cross-sectional view illustrating a portion of the area of the electronic panel illustrated in FIG. 7.

FIG. 7 is an enlarged plan view illustrating a portion of the area of the electronic panel according to an embodiment of the inventive concept. FIG. 8 is a cross-sectional view illustrating a portion of the area of the electronic panel illustrated in FIG. 7. For convenience of description, only the conductive patterns forming the input sensing member SU is illustrated in FIG. 7, and the first, second, and third insulation layers 30, 40, and 50 (see FIG. 4A) are not shown. The same reference numerals are used for the same components as those of FIGS. 5 to 6A, and duplicated descriptions will be omitted.

Referring to FIG. 7, adjacent first sensor patterns SP1 may be connected to each other by the first connection pattern BP1 that extends in the fourth direction DR4 and the fifth direction DR5. The first connection pattern BP1 may include a first sub pattern BP1-1 and a second sub pattern BP1-2. The first sub pattern BP1-1 and the second sub pattern BP1-2 may be disposed on the same layer. Each of the first sub pattern PB1-1 and the second sub pattern BP1-2 may be formed by the mesh lines MSL or provided as a transparent pattern. The first sub pattern BP1-1 and the second sub pattern BP1-2 may be connected to each other by one or more branch patterns disposed between the first sub pattern BP1-1 and the second sub pattern BP1-2.

The first connection pattern BP1 and the second connection pattern BP2 may be disposed on layers that are different from each other. In the present embodiment, the first connection pattern BP1 may be disposed on a layer that is different from the layers of the first sensor patterns SP1, the second sensor patterns SP2, and the second connection pattern BP2.

The first connection pattern BP1 may overlap a portion of the first sensor patterns SP1 in a plan view. The first sub pattern BP1-1 may be connected to the first sensor patterns SP1 through a first contact hole CH_S1. The second sub pattern BP1-2 may be connected to the first sensor patterns SP1 through a second contact hole CH_S2.

A portion of the second sensor patterns SP2 that overlaps the first connection pattern BP1 may be removed. Thus, a parasitic capacitance that may be generated between the second sensor patterns SP2 and the first connection pattern BP1 or a short circuit that may occur in the manufacturing process may be prevented to improve reliability of the electronic panel EP-3. As illustrated in FIG. 8, the electronic panel EP-3 may include the first connection pattern BP1 disposed below the second connection pattern BP2. A first conductive layer 10-3 may include first conductive patterns 11-3 and 12-3.

The first conductive patterns 11-3 and 12-3 may form the first connection pattern BP1. The first conductive patterns 11-3 and 12-3 may be connected to each other in different directions (not shown). At least one of the first conductive patterns 11-3 and 12-3 may include sub conductive patterns 12-A and 12-B that are connected to the first sensor patterns SP1 through the first and second contact holes CH_S1 and CH_S2 shown in FIG. 7.

The first sensor patterns SP1, the second sensor patterns SP2, and the second connection pattern BP2 may be disposed on the same layer. The first sensor patterns SP1, the second sensor patterns SP2, and the second connection pattern BP2 may be disposed on the first connection pattern BP1. A second conductive layer 20-3 may include the first sensor patterns SP1, the second sensor patterns SP2, and the second connection pattern BP2. The second conductive layer 20-3 may include second conductive patterns 21-3 and 22-3.

The second conductive patterns 21-3 and 22-3 may form the first sensor patterns SP1, the second sensor patterns SP2, and the second connection pattern BP2. In the present embodiment, the second sensor patterns SP2 and the second connection pattern BP2 may be formed by the third pattern 21-3 of the second conductive layer 20-3, and the first sensor patterns SP1 may be formed by the fourth pattern 22-3. As described above, the third pattern 21-3 may be disposed to be spaced apart from the first conductive layer 10-3 in a cross-sectional view. The third pattern 21-3 may be disposed on the top surface of the first organic insulation layer 30 and thus may not be directly connected to the first conductive layer 10-3.

The fourth pattern 22-3 may pass through a first organic insulation layer 30-3 of an input sensing member SU-3. The fourth pattern 22-3 may be connected to the second pattern 12-3 of the first conductive layer 10-3. For example, at least a portion of the fourth pattern 22-3 may include sub patterns 22-A and 22-B that are connected to the first connection pattern BP1 through the first and second contact hole CH_S1 and CH_S2 shown in FIG. 7. The fourth pattern 22-3 may be directly connected to the first conductive layer 10-3.

Figure 9:
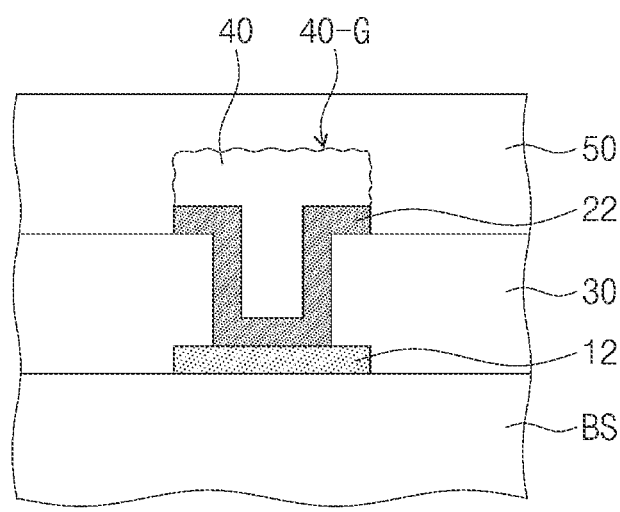
FIG. 9 is an enlarged cross-sectional view illustrating a portion of an input sensing member according to an embodiment of the inventive concept.
Figure 9:
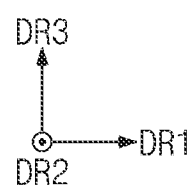

FIG. 9 is an enlarged cross-sectional view illustrating a portion of the input sensing member according to an embodiment of the inventive concept. The same reference numerals are used for the same components as those of FIGS. 1 to 5, and duplicated descriptions will be omitted.

According to an embodiment of the inventive concept, an interface 40-G of the pattern layer 40, on which the pattern layer 40 and the second insulation layer 50 contact each other, may have an outer surface having a non-uniform shape or surface. The fourth pattern 22 may be formed by patterning a preliminary conductive layer disposed on the base layer BSL. The preliminary conductive layer may be patterned by using the pattern layer 40 including the organic material as a mask. In the process of patterning the preliminary conductive layer, an outer surface of the pattern layer 40 used as the mask may be damaged. Thus, an interface 40-G of the pattern layer 40 contacting the second insulation layer 50 may have a non-uniform shape or surface.

According to the inventive concept, the pattern layer 40 may include the same material as the second organic insulation layer 50. However, since the pattern layer 40 is used as the mask for patterning the conductive patterns, the pattern layer 40 and the second organic insulation layer 50 may be distinguished from each other through the interface 40-G.

FIGS. 10A to 10I are cross-sectional views illustrating a method for manufacturing an electronic panel according to an embodiment of the inventive concept. In FIGS. 10A to 10I, for convenience of description, the electronic panel EP of FIG. 6A will be described. The same reference numerals are used for the same components as those of FIG. 6A, and duplicated descriptions will be omitted. Hereinafter, a method for manufacturing an electronic panel EP will be described with reference to FIGS. 10A to 10I.

As illustrated in FIG. 10A, a first conductive layer 10 is formed on a base substrate BS. The base substrate BS may correspond to the above-described display member DU or an insulation substrate. The first conductive layer 10 includes a plurality of first conductive patterns 11 and 12.

Although not shown, the first conductive patterns 11 and 12 may be formed by disposing a conductive material to form a conductive material layer on a top surface of the base substrate BS. Each of the first conductive patterns 11 and 12 may correspond to a first connection pattern BP1 that is disposed in an active area AA of the electronic panel EP.

Thereafter, as illustrated in FIG. 10B, a first initial layer 30I is formed on the first conductive layer 10. The first initial layer 30I may include an organic material. The first initial layer 30I may be formed by applying the organic material on a top surface of the base substrate BS and the first conductive layer 10.

Thereafter, as illustrated in FIG. 10C, an opening 30-OP is formed in the first initial layer 30I to form a first organic insulation layer 30. The opening 30-OP may be formed by removing a portion of the first initial layer 30I that overlaps the first conductive layer 10 to expose the overlapping portion of the second pattern 12 of the first conductive layer 10.

Thereafter, as illustrated in FIG. 10D, a second initial layer 20I is formed on the first insulation layer 30. The second initial layer 20I may cover a top surface of the first organic insulation layer 30. The second initial layer 20I may be filled into the opening 30-OP. Here, the second initial layer 20I may contact a top surface of a portion of the second pattern 12 of the first conductive layer 10 that is exposed through the opening 30-OP.

The second initial layer 20I may include a conductive material. The second initial layer 20I may be formed to have a laminated structure in which a plurality of conductive material layers are sequentially formed. The second initial layer 20I may be formed by a deposition process.

Figure 10G:
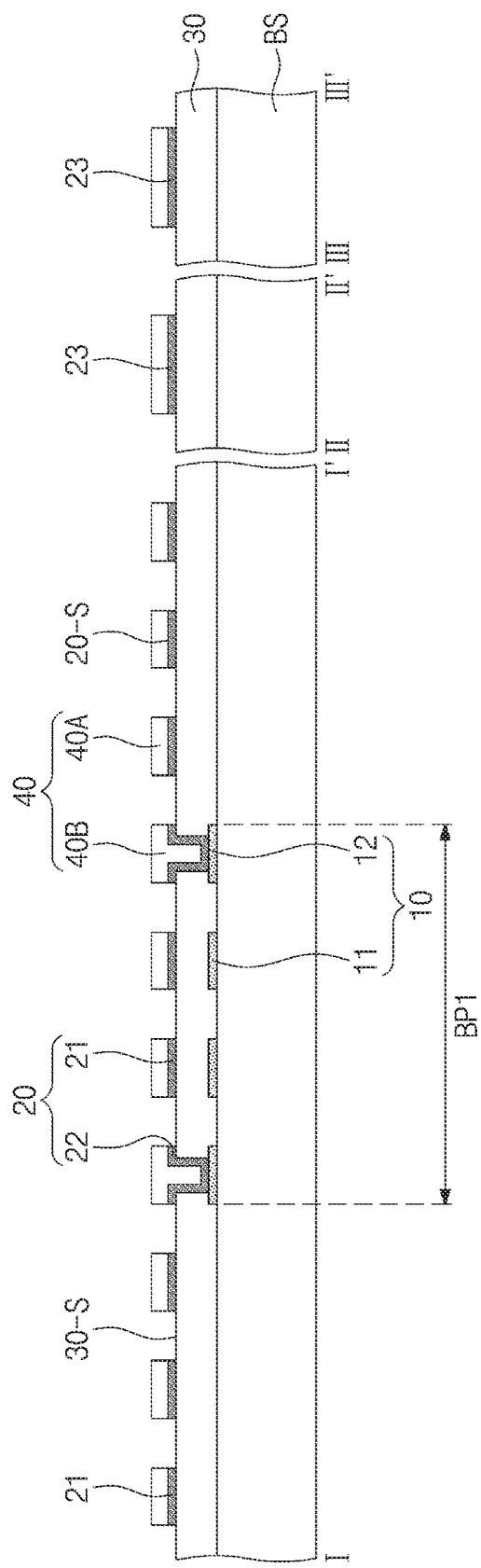

Thereafter, as illustrated in FIGS. 10E to 10G, a preliminary pattern layer 40I is formed on the second initial layer 20I. The preliminary pattern layer 40I may include an organic material. The preliminary pattern layer 40I may be formed by applying the organic material to a top surface of the second initial layer 20I.

Thereafter, an etching process EC is performed to etch the preliminary pattern layer 40I by using a mask MS. A portion of the preliminary pattern layer 40I except for an area that overlaps the mask MS may be removed through the etching process EC. As a result, a pattern layer 40 including a plurality of patterns are formed on the second initial layer 20I through the etching process EC of the preliminary pattern layer 40I.

Thereafter, a photolithography process PT is performed to form a second conductive layer 20 by using the pattern layer 40 as a mask. More specifically, the second conductive layer 20 may be formed by removing portions of the second initial layer 20I to which light is irradiated by using the pattern layer 40 as the mask, through a developing process after the light is irradiated onto the irradiated portions of the second initial layer 20I. The second conductive layer 20 includes a plurality of second conductive patterns 21 and 22 and a connection pattern 23.

Figure 10H:
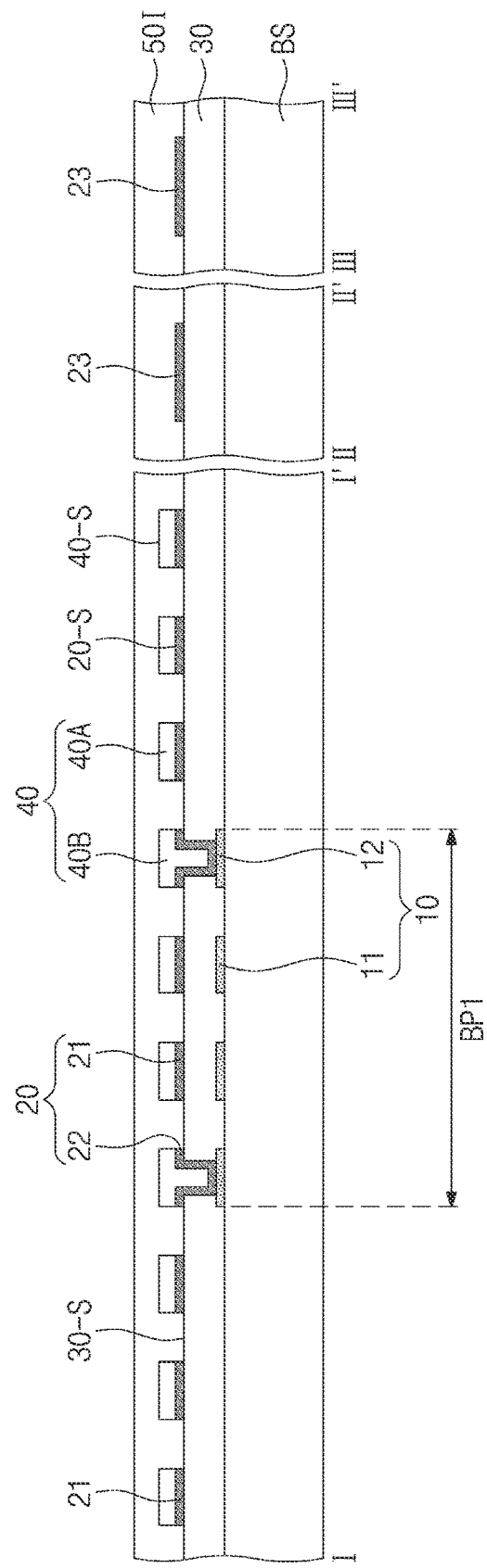

Thereafter, as illustrated in FIG. 10H, a third initial layer 50I is formed on the first organic insulation layer 30 that are exposed by the pattern layer 40 and the second conductive layer 20.

The third initial layer 50I may include an organic material. The third initial layer 50I may be formed by applying a liquid organic material to a top surface of the portions of the first organic insulation layer 30 that are exposed by the pattern layer 40 and the second conductive layer 20.

According to an embodiment, the third initial layer 50I may be applied to the portions of the pattern layer 40 that are removed by the etching process EC. The third initial layer 50I may include the same material as the first organic insulation layer 30.

Figure 10I:
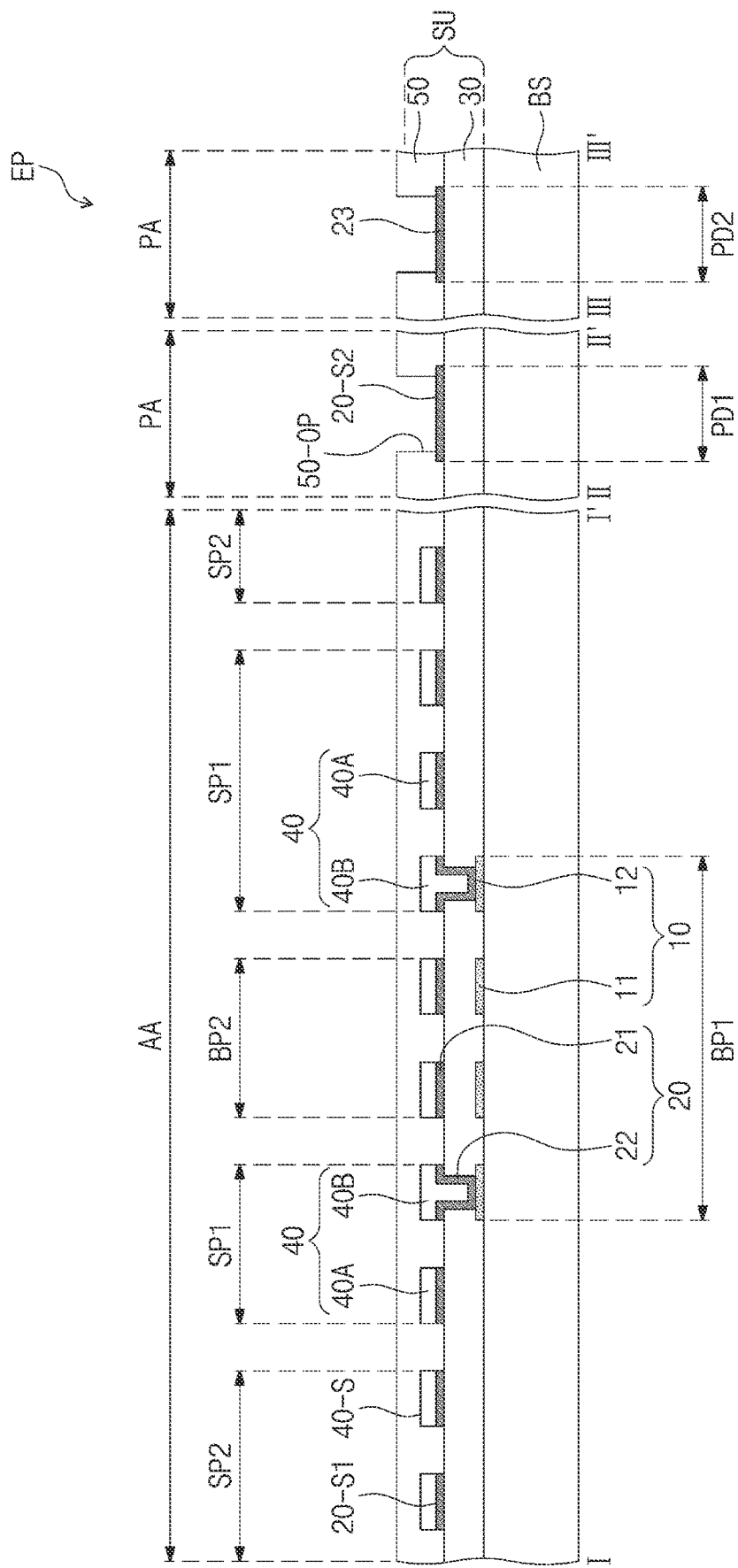

Thereafter, as illustrated in FIG. 10I, a second organic insulation layer 50 may be formed by removing a portion of the third initial layer 50I to expose a top surface 20-S2 of the connection pattern 23, and the electronic panel EP is formed. The second organic insulation layer 50 may overlap the active area AA and the pad area PA of the electronic panel EP. The second organic insulation layer 50 may cover a top surface 40-S of the pattern layer 40.

An opening 50-OP may be formed in the third initial layer 50I to form the second organic insulation layer 50. The opening 50-OP may be formed by removing a portion of the third initial layer 50I that overlap a portion of the second conductive layer 20 to expose the top surface 20-S2 of the second conductive layer 20.

The second organic insulation layer 50 may be disposed in the pad area PA of the electronic panel EP to expose the top surface 20-S2 of the connection pattern 23 that defines the pads PD1 and PD2. As described above, the top surface 20-S2 of the connection pattern 23 defining the pads PD1 and PD2 may be connected to the circuit board CB (see FIG. 1).

According to an embodiment of the inventive concept, the pattern layer 40 that is formed on the second conductive layer 20 may prevent the organic layer disposed below the conductive layer from being damaged or removed in a process that may be otherwise used to remove photoresist patterns by using a strip solution to form the conductive layer. In addition, the pattern layer 40 may include the same material as the second organic insulation layer 50, and thus, a process of forming or removing separate photoresist patterns may not need to be additionally performed. Thus, the processing cost and manufacturing time of the electronic panel EP may be reduced.

FIGS. 11A to 11J are cross-sectional views illustrating a method of manufacturing an electronic panel according to an embodiment of the inventive concept. In FIGS. 11A to 11J, for convenience of description, the electronic panel EP-2 shown in FIG. 6C will be described. The same reference numerals are used for the same components as those of FIG. 6C, and duplicated descriptions with respect to that of FIGS. 10A to 10I will be omitted. Hereinafter, a method for manufacturing the electronic panel EP-2 will be described with reference to FIGS. 11A to 11J.

As illustrated in FIG. 11A, a first conductive layer 10-2 is formed on a base substrate BS-2. The first conductive layer 10-2 includes first conductive patterns 11-2, second conductive patterns 12-2, and lower connection pads 13-2.

Thereafter, as illustrated in FIG. 11B, a first initial layer 30I-2 is formed on the first conductive layer 10-2.

Thereafter, as illustrated in FIG. 11C, an opening 30-OP is formed in the first initial layer 30I-2 to form a first organic insulation layer 30-2. The opening 30-OP may be formed by removing a portion of the first initial layer 30I-2 that overlaps the lower connection pads 13-2 to expose a portion of each of the second conductive patterns 12-2 and the lower connection pads 13-2.

Thereafter, as illustrated in FIG. 11D, a second initial layer 20I-2 is formed on the first insulation layer 30-2. The second initial layer 20I-2 may cover a top surface of the first organic insulation layer 30-2. The second initial layer 20I-2 may be filled into the opening 30-OP. Here, the second initial layer 20I-2 may contact a top surface of each of the second conductive patterns 12-2 and the lower connection pads 13-2 that are exposed through the opening 30-OP.

Figure 11E:
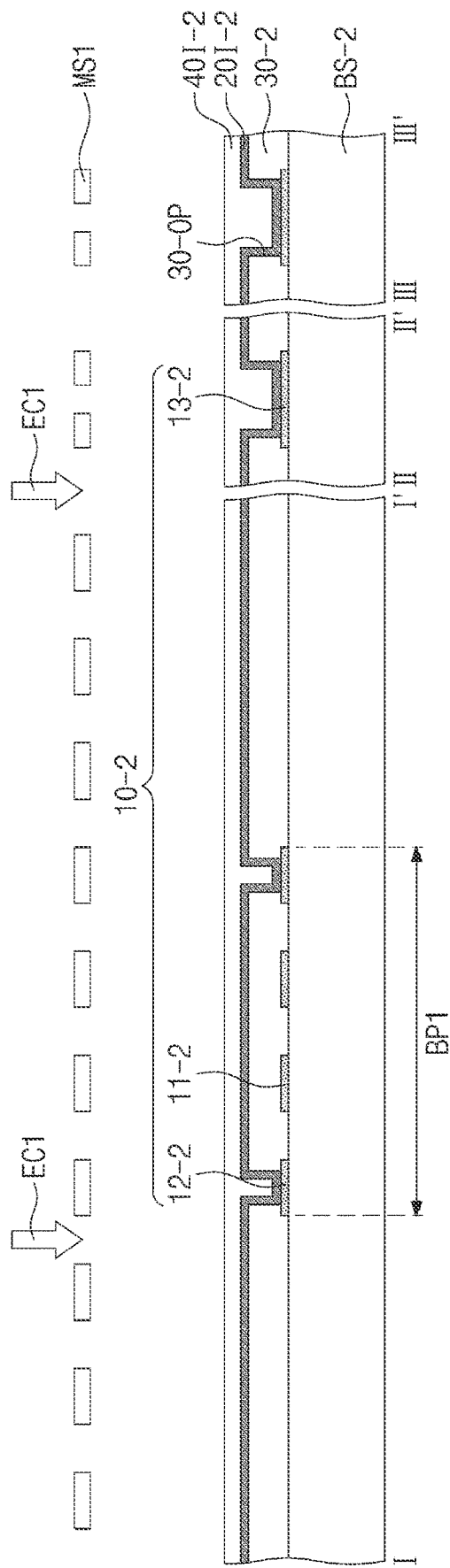
Figure 11F:
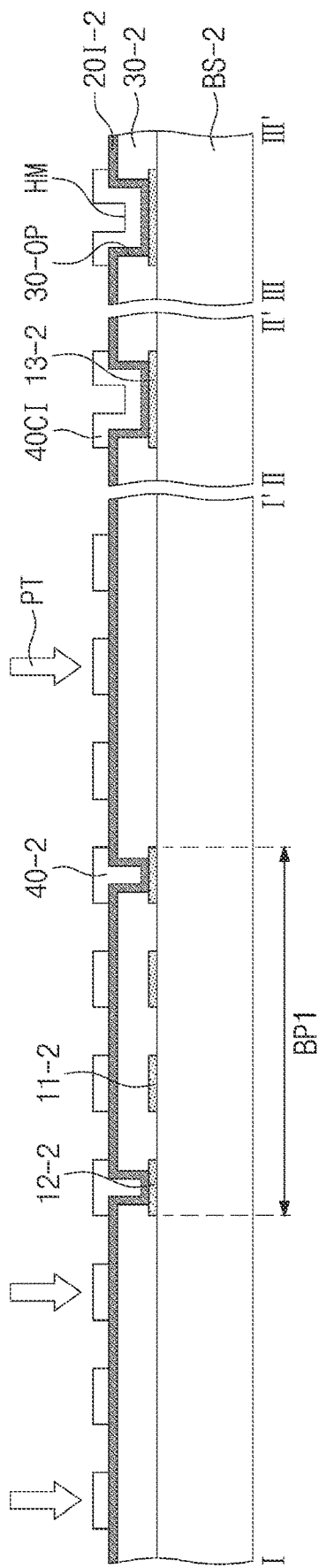

Thereafter, as illustrated in FIGS. 11E to 11F, a preliminary pattern layer 40I-2 is formed on the second initial layer 20I-2.

Thereafter, the first etching process EC1 is performed to etch the preliminary pattern layer 40I-2 by using a first mask MS1. A portion of the preliminary pattern layer 40I-2 except for an area that overlaps the first mask MS1 may be removed through the first etching process EC1. As a result, a pattern layer 40-2 including a plurality of patterns are formed on the second initial layer 20I-2 through the first etching process EC1 of the preliminary pattern layer 40I-2.

Thereafter, a photolithography process PT is performed to form a second conductive layer 20-2 by using the pattern layer 40-2 as a mask. More specifically, the second conductive layer 20-2 may be formed by removing portions of the second initial layer 20I-2 to which light is irradiated by using the pattern layer 40-2 as the mask, through a developing process after the light is irradiated onto the irradiated portions of the second initial layer 20I-2. The second conductive layer 20-2 includes a plurality of second conductive patterns 21-2 and 22-2 and a connection pattern 23-2. The connection pattern 23-2 may be connected to the lower connection pads 13-2 through the opening 30-OP.

Figure 11G:
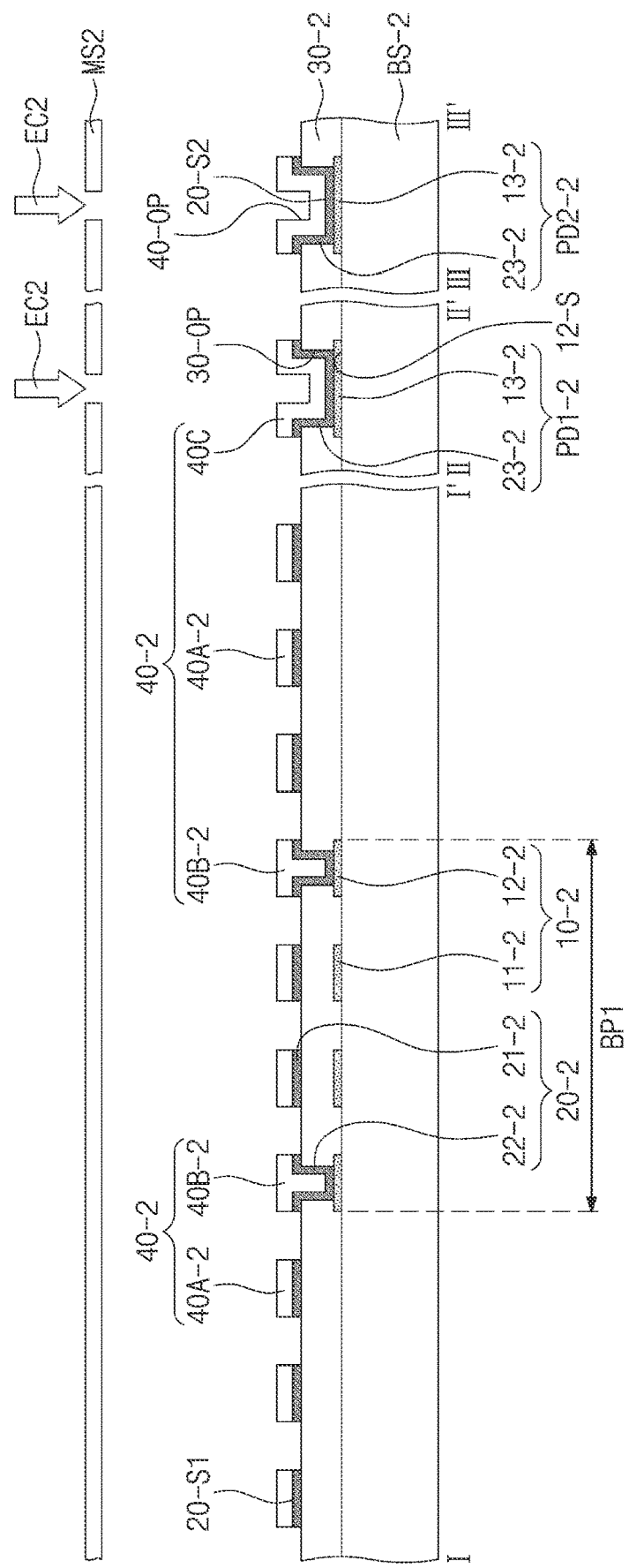
Figure 11H:
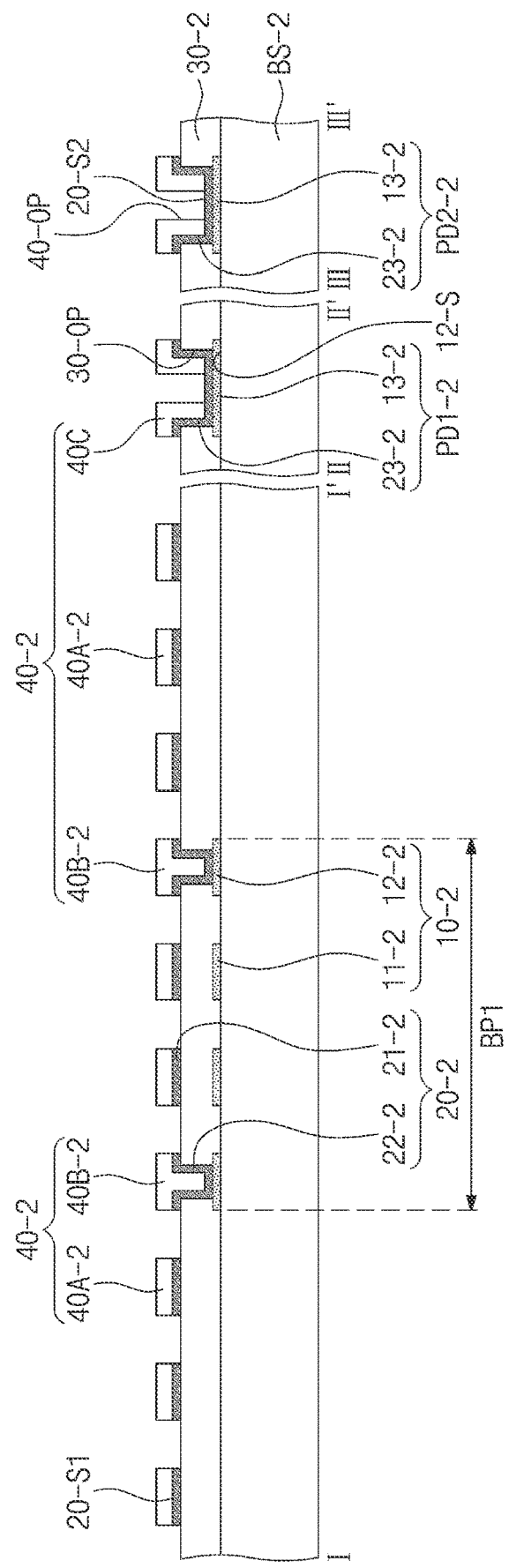

Thereafter, as illustrated in FIGS. 11G to 11H, the second etching process EC2 is performed to etch a center portion of the pad pattern layer 40C by using a second mask MS2. The center portion of the pad pattern layer 40C that is formed in the opening 30-OP among a plurality of organic patterns 40A-2, 40B-2, and 40C-2 of the pattern layer 40-2 is removed through the second etching process EC2.

Thus, a portion of a top surface 20-S2 of the second conductive layer 20-2 that overlaps the opening 30-OP may be exposed. Referring to FIG. 11H, a portion of the top surface 20-S2 of the connection pattern 23-2 may be exposed.

Figure 11I:
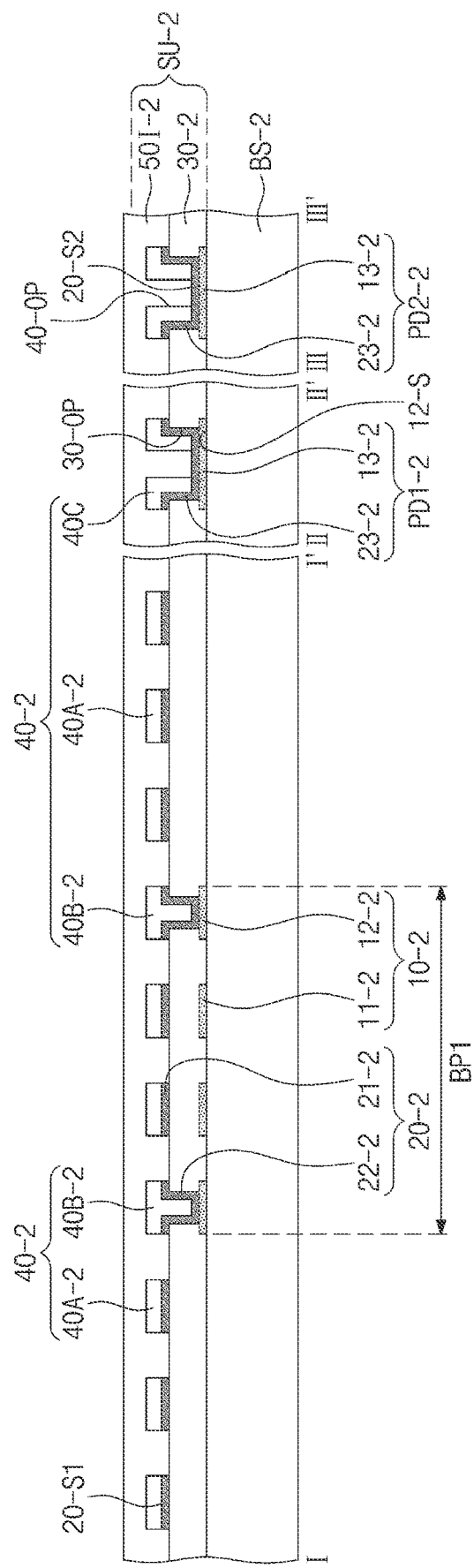

Thereafter, as illustrated in FIG. 11I, a third initial layer 50I-2 is formed on the first organic insulation layer 30-2 that are exposed by the pattern layer 40-2 and the second conductive layer 20-2.

Figure 11J:
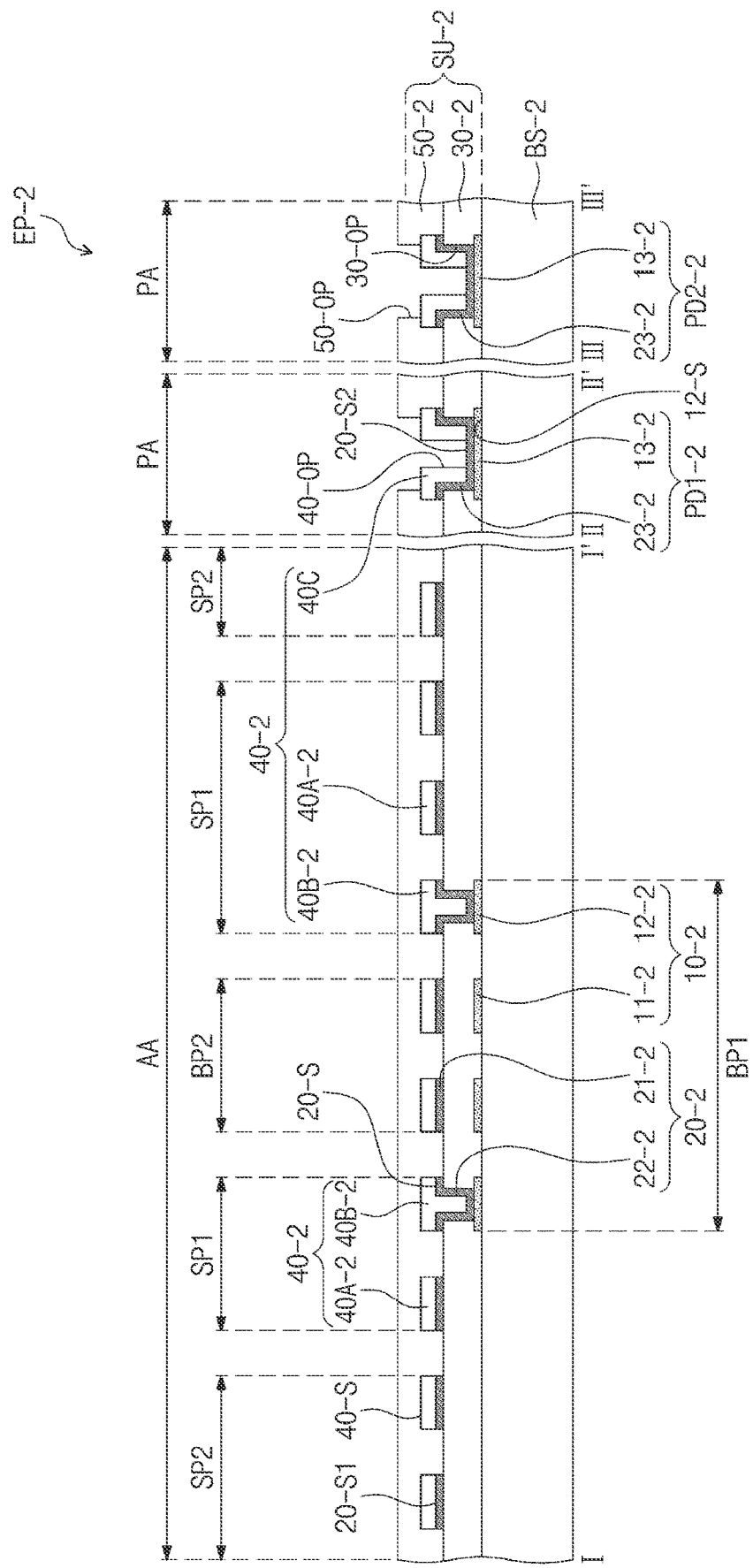

Thereafter, as illustrated in FIG. 11J, a second organic insulation layer 50-2 may be formed by removing a portion of the third initial layer 50I-2 to expose a top surface 20-S2 of the connection pattern 23-2, and the electronic panel EP-2 is formed.

The second organic insulation layer 50-2 may overlap the active area AA and the pad area PA. The second organic insulation layer 50-2 may cover a top surface 40-S of the pattern layer 40-2.

An opening 50-OP may be formed in the third initial layer 50I-2 to form a second organic insulation layer 50-2. The opening 50-OP may be formed by removing the third initial layer 50I-2 that overlaps a portion of the second conductive layer 20-2 to expose the top surface 20-S2 of the second conductive layer 20-2.

According to the inventive concept, the pattern layer including the same material as the organic insulation layer covering the conductive patterns may be provided to improve the chemical resistance of the organic insulation layer. Thus, a damage to the organic insulation layer may be prevented by a chemical solution that may be provided during the manufacturing process.

It will be apparent to those skilled in the art that various modifications and variations can be made without departing from the scope and spirit of the present disclosure. Thus, it is intended that the present disclosure covers the modifications and variations of the inventive concepts provided as they come within the scope of the exemplary embodiments disclosed herein and their equivalents.

Hence, the protective scope of the inventive concept shall be determined by the technical scope of the accompanying claims.

What is claimed is:

1. A method for manufacturing an electronic panel, the method comprising:
    forming first conductive patterns on a base substrate;
    forming a first organic insulation layer covering the first conductive patterns;
    forming a preliminary conductive layer on the first organic insulation layer;
    forming a preliminary pattern layer on the preliminary conductive layer;
    etching the preliminary pattern layer by using a first mask to form a plurality of organic patterns;
    patterning the preliminary conductive layer by using the plurality of organic patterns as a second mask to form second conductive patterns; and
    forming a second organic insulation layer on the second conductive patterns,
    wherein the plurality of organic patterns are made of the same material as the second organic insulation layer.

2. The method of claim 1, after the forming of the plurality of organic patterns, further comprising etching a portion of the plurality of organic patterns by using the first mask and the second mask to expose a top surface of each of the second conductive patterns that overlaps the portion of the plurality of organic patterns that is etched.

3. The method of claim 1, wherein the second organic insulation layer covers top surfaces of the plurality of organic patterns and a top surface of the first organic insulation layer that is exposed by the plurality of organic patterns.

* * * * *